United States Patent
Kim

(10) Patent No.: US 10,008,493 B2
(45) Date of Patent: Jun. 26, 2018

(54) SEMICONDUCTOR DEVICE AND METHOD OF FABRICATING THE SAME

(71) Applicant: SAMSUNG ELECTRONICS CO., LTD., Suwon-si, Gyeonggi-do (KR)

(72) Inventor: Ju-Youn Kim, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/083,450

(22) Filed: Mar. 29, 2016

(65) Prior Publication Data

US 2016/0358914 A1   Dec. 8, 2016

(30) Foreign Application Priority Data

Jun. 8, 2015  (KR) .......... 10-2015-0080511
Aug. 5, 2015  (KR) .......... 10-2015-0110481

(51) Int. Cl.
  *H01L 21/8234*  (2006.01)
  *H01L 27/088*  (2006.01)
  *H01L 29/66*  (2006.01)
  *H01L 29/423*  (2006.01)

(52) U.S. Cl.
  CPC .. *H01L 27/0886* (2013.01); *H01L 21/823431* (2013.01); *H01L 21/823481* (2013.01); *H01L 29/4236* (2013.01); *H01L 29/66545* (2013.01)

(58) Field of Classification Search
  CPC ... H01L 27/088; H01L 21/8234; H01L 29/06; H01L 29/423; H01L 29/66
  See application file for complete search history.

(56) References Cited

U.S. PATENT DOCUMENTS

| | | | |
|---|---|---|---|
| 6,177,303 B1 | 1/2001 | Schmitz et al. | |
| 8,153,498 B2 | 4/2012 | Hsu et al. | |
| 8,502,316 B2 | 8/2013 | Fung et al. | |
| 8,546,208 B2 * | 10/2013 | Anderson | H01L 21/84 257/E21.453 |
| 8,609,510 B1 | 12/2013 | Banna et al. | |
| 8,871,597 B2 | 10/2014 | Shieh et al. | |
| 2014/0001572 A1 | 1/2014 | Bohr et al. | |
| 2014/0035045 A1 | 2/2014 | Alptekin et al. | |
| 2014/0117454 A1 * | 5/2014 | Liu | H01L 29/6681 257/368 |
| 2014/0167178 A1 | 6/2014 | Tsai et al. | |
| 2014/0367803 A1 | 12/2014 | Yu et al. | |
| 2015/0021695 A1 * | 1/2015 | Hu | H01L 29/785 257/368 |
| 2015/0021710 A1 | 1/2015 | Hsu et al. | |

* cited by examiner

*Primary Examiner* — Asok K Sarkar
*Assistant Examiner* — Dmitriy Yemelyanov
(74) *Attorney, Agent, or Firm* — Lee & Morse P.C.

(57) ABSTRACT

A semiconductor device includes a first fin-shaped pattern and a second fin-shaped pattern arranged in a row in a direction, a trench between the first fin-shaped pattern and the second fin-shaped pattern, a field insulating layer filling a portion of the trench, an insulating line pattern crossing between the first fin-shaped pattern and the second fin-shaped pattern on the field insulating layer. A bottom surface of the insulating line pattern is lower than top surfaces of the first and second fin-shaped patterns.

20 Claims, 23 Drawing Sheets

1200

1300

1400

SEMICONDUCTOR DEVICE AND METHOD OF FABRICATING THE SAME

This application claims priority under 35 U.S.C. § 119 to Korean Patent Application No. 10-2015-0080511, filed on Jun. 8, 2015, and Korean Patent Application No. 10-2015-0110481, filed on Aug. 5, 2015, in the Korean Intellectual Property Office, the disclosures of which are hereby incorporated by reference in their entirety.

BACKGROUND

1. Technical Field

The present disclosure relates to a semiconductor device and a method of fabricating the same, and more particularly, to a semiconductor device including a fin-shaped pattern and a method of fabricating the same

2. Description of the Related Art

As one of the scaling technologies for increasing the integration of a semiconductor device, there has been proposed a multi-gate transistor, in which a fin-shaped or nanowire-shaped multi-channel active pattern (or silicon body) is formed on a substrate, and a gate is formed on the surface of the multi-channel active pattern.

Since this multi-gate transistor uses a three-dimensional channel, it can be easily scaled. The multi-gate transistor can improve a current control capability even though a gate length of the multi-gate transistor is not increased. In addition, a short channel effect (SCE) that an electrical potential of a channel region is influenced by drain voltage can be effectively suppressed.

SUMMARY

According to example embodiments, a semiconductor device may include a first fin-shaped pattern and a second fin-shaped pattern arranged in a row in a first direction, a trench formed between the first fin-shaped pattern and the second fin-shaped pattern, a field insulating layer filling a portion of the trench, and an insulating line pattern on the field insulating layer between the first fin-shaped pattern and the second fin-shaped pattern. The insulating line pattern may be spaced apart from the first and second fin-shaped patterns. The insulating line pattern may extend in a second direction across the first direction and may have a bottom surface lower than top surfaces of the first and second fin-shaped patterns.

In some embodiments, the insulating line pattern may be in direct contact with the field insulating layer.

In some embodiments, the device may further include a liner on a sidewall of the insulating line pattern. A height of the insulating line pattern may be substantially equal to a height of the insulating line pattern.

In some embodiments, the liner may be not in contact with the first and second fin-shaped patterns.

In some embodiments, the liner may include a material having an etch selectivity with respect to the insulating line pattern.

In some embodiments, the device may further include a liner between the insulating line pattern and the field insulating layer.

In some embodiments, the liner may include a first portion extending along the bottom surface of the insulating line pattern and a second portion extending along the sidewall of the insulating line pattern.

In some embodiments, a thickness of the first portion of the liner may be less than a thickness of the second portion of the liner.

In some embodiments, the device may further include a first gate electrode on the first fin-shaped pattern and a second gate electrode on the second fin-shaped pattern. A top surface of the first gate electrode, a top surface of the second gate electrode, and a top surface of the insulating line pattern may be substantially coplanar with each other.

In some embodiments, the device may further include an interlayer insulating layer covering sidewalls of the first and second gate electrodes and the insulating line pattern and disposing on the first and second fin-shaped patterns and the field insulating layer. A top surface of the interlayer insulating layer may be substantially coplanar with a top surface of the insulating line pattern.

According to other example embodiments, a semiconductor device may include a first fin-shaped pattern and a second fin-shaped pattern adjacent to each other, a field insulating layer covering lower portions of the first and second fin-shaped patterns, and an interlayer insulating layer. Each of the first and second fin-shaped patterns may have a long side and a short side. Upper portions of the first and second fin-shaped pattern protrude above the field insulating layer. The interlayer insulating layer may cover the upper portions of the first and second fin-shaped patterns and the field insulating layer. The interlayer insulating layer may include a first trench exposing a top surface of the field insulating layer between the short side of the first fin-shaped pattern and the short side of the second fin-shaped pattern. The first trench may be spaced apart from the first and second fin-shaped patterns. An insulating line pattern may be formed in the first trench. A height of the insulating line pattern may be greater than a height of the upper portion of the first fin-shaped pattern and greater than a height of the upper portion of the second fin-shaped pattern.

In some embodiments, the insulating line pattern may directly contact the field insulating layer.

In some embodiments, the device may further include a liner in the first trench. The first liner may be formed along a bottom surface and a sidewall of the first trench, and a thickness of the liner on a sidewall of the first trench may be greater than a thickness of the liner on a bottom surface of the first trench.

In some embodiments, the interlayer insulating layer may further include a second trench on the upper portion of the first fin-shaped pattern and the third trench on the upper portion of the second fin-shaped pattern. The device may further include a first gate electrode that is disposed in the second trench and on the first fin-shaped pattern, and a second gate electrode that is disposed in the third trench and on the second fin-shaped pattern. Top surfaces of the first and second gate electrode may be substantially coplanar with a top surface of the insulating line pattern.

In some embodiments, the device may further include a first source/drain region in the upper portion of the first fin-shaped pattern between the first gate electrode and the insulating line pattern, and a second source/drain region in the upper portion of the second fin-shaped pattern between the second gate electrode and the insulating line pattern.

According to yet other example embodiments, a semiconductor device may include a first fin-shaped pattern extending in a first direction on a substrate, a field insulating layer covering a portion of the first fin-shaped pattern on the substrate, and a line pattern on the field insulating layer and the first fin-shaped pattern and extending in a second direction different from the first direction. The line pattern may include a gate electrode and an insulating line pattern which are laterally adjacent to each other. The gate electrode may cross the first fin-shaped pattern. A bottom surface of the insulating line pattern may be lower than a top surface of the first fin-shaped pattern.

In some embodiments, the device may further include a second fin-shaped pattern and a third fin-shaped pattern arranged in a row in the first direction. The field insulating layer may cover a portion of each of the second and third fin-shaped patterns. The first to third fin-shaped patterns may be arranged in the second direction, and the insulating line pattern crosses between the second fin-shaped pattern and the third fin-shaped pattern in the second direction.

In some embodiments, the device may further include a high-k dielectric layer on the first fin-shaped pattern and the field insulating layer. The high-k dielectric layer extends between a sidewall of the insulating line pattern and a sidewall of the gate electrode, which face each other.

In some embodiments, the device may further include a liner between the high-k dielectric layer and the sidewall of the insulating line pattern.

In some embodiments, the device may further include a liner between a top surface of the field insulating layer and a bottom surface of the insulating line pattern.

In some embodiments, the liner may extend between a sidewall of the insulating line pattern and a sidewall of the gate electrode, which face each other.

According to still other example embodiments, a method of manufacturing a semiconductor device may include forming a first fin-shaped pattern and a second fin-shaped pattern arranged in a row in a first direction on a substrate, forming a field insulating layer covering a portion of the first fin-shaped pattern and a portion of the second fin-shaped pattern on the substrate, forming a first dummy gate electrode on the first fin-shaped pattern, a second dummy gate electrode on a second fin-shaped pattern and a third dummy gate electrode on the field insulating layer between the first fin-shaped pattern and the second fin-shaped pattern, forming an interlayer insulating layer on the substrate to cover the first and second fin-shaped patterns and the field insulating layer and expose top surfaces of the first to third dummy gate electrodes, forming a mask pattern on the interlayer insulating layer to cover the top surfaces of the first and second gate electrodes and expose the top surface of the third dummy gate electrode, forming a first trench in the interlayer insulating layer by removing the third dummy gate electrode, and forming an insulating line pattern filling the first trench. The third dummy gate electrode may be spaced apart from the first and second fin-shaped patterns.

In some embodiments, the method may further include exposing the top surfaces of the first and second dummy gate electrodes by removing the mask pattern, forming a second trench and a third trench in the interlayer insulating layer, and forming a first gate electrode filling the second trench and a second gate electrode filling the third trench. The second trench may be formed by removing the first dummy gate electrode, and the third trench is formed by removing the second dummy gate electrode. The second trench may expose the first fin-shaped pattern, and the third trench may expose the second fin-shaped pattern.

In some embodiments, the method may further include forming a liner extending along a sidewall and a bottom surface of the first trench, before forming the insulating line pattern.

In some embodiments, the forming a first trench may include exposing a top surface of the field insulating layer.

BRIEF DESCRIPTION OF THE DRAWINGS

The above and other aspects and features will become more apparent by describing in detail example embodiments with reference to the attached drawings, in which.

DETAILED DESCRIPTION OF THE EMBODIMENTS

Figure 1:
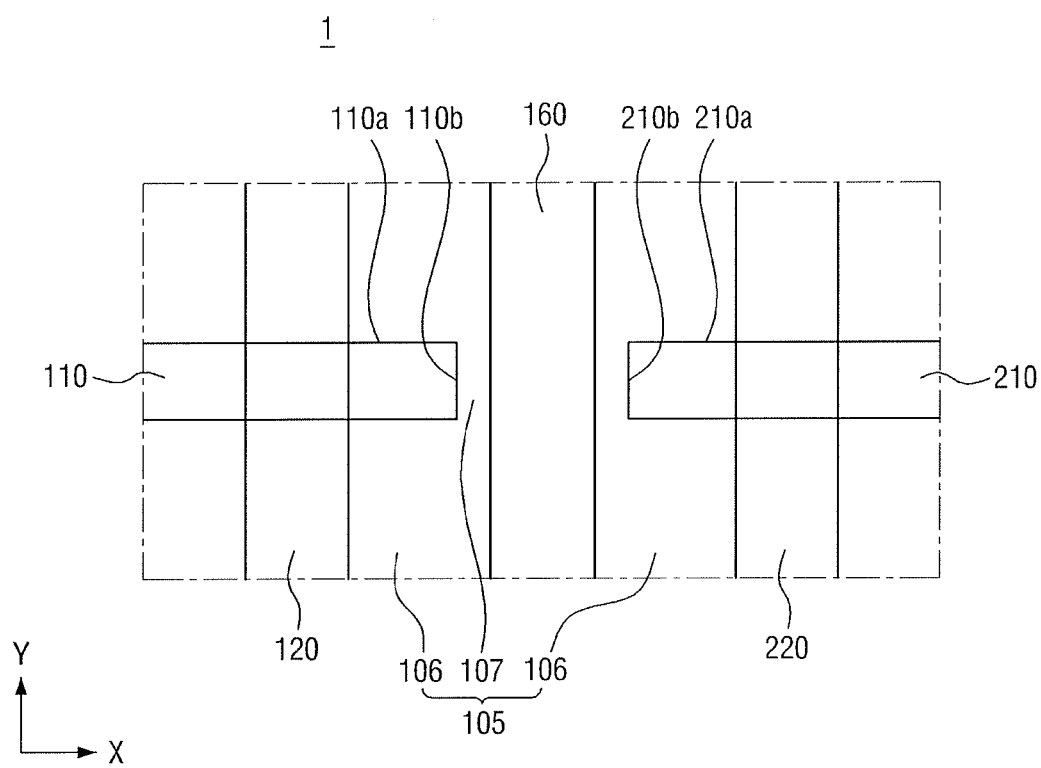
FIGS. 1 and 2 are a layout diagram and a perspective view for explaining a semiconductor device according to example embodiments, respectively.

Various example embodiments will now be described more fully with reference to the accompanying drawings in which some example embodiments are shown. However, specific structural and functional details disclosed herein are merely representative for purposes of describing example embodiments. Thus, the present disclosure may be embodied in many alternate forms and should not be construed as limited to only the example embodiments set forth herein. Therefore, it should be understood that there is no intent to limit the example embodiments to the particular forms disclosed, but on the contrary, the example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. The regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. The two different directions may or may not be orthogonal to each other. The three different directions may include a third direction that may be orthogonal to the two different directions. The plurality of device structures may be integrated in a same electronic device. For example, when a single active region is illustrated in a cross-sectional view of a device/structure, the device/structure may include a plurality of active regions and transistor structures thereon, as would be illustrated by a plan view of the device/structure. The plurality of device structures may be arranged in an array and/or in a two-dimensional pattern.

In order to more specifically describe example embodiments, various features will be described in detail with reference to the attached drawings. However, the example embodiments are not limited thereto.

Hereinafter, a semiconductor device according to example embodiments will be described with reference to FIGS. 1 through 5b.

Figure 2:
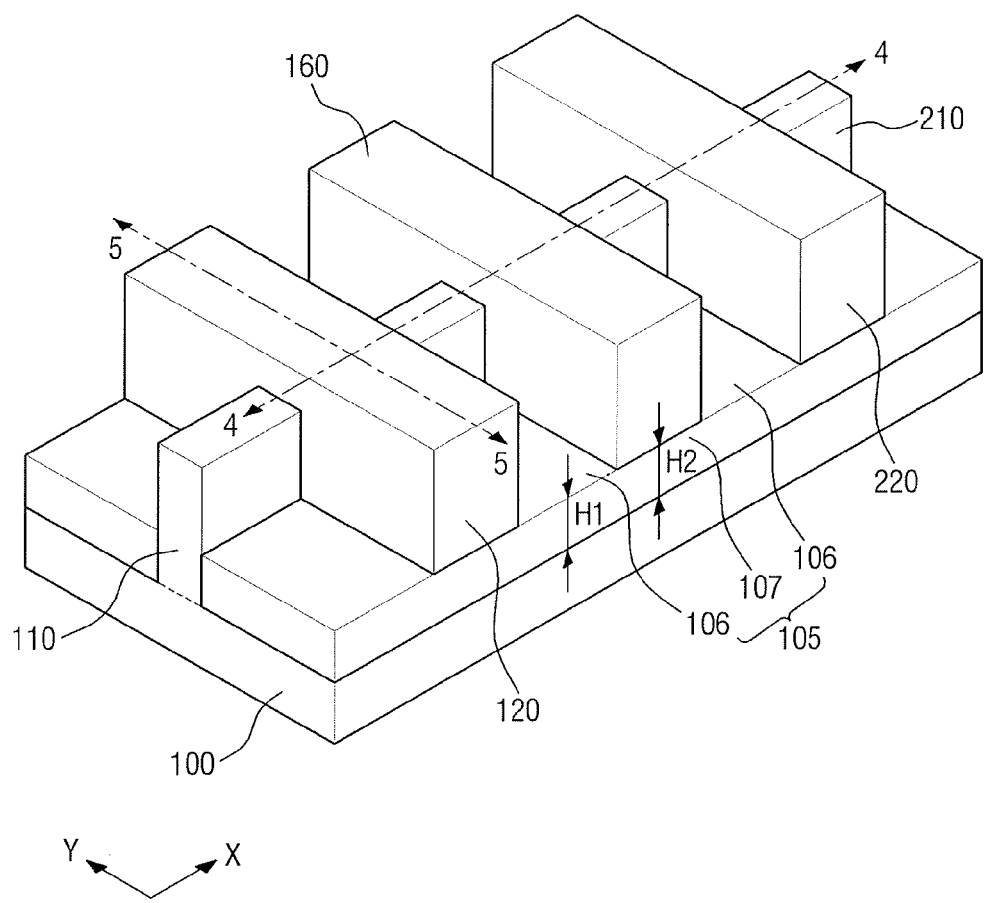
Figure 3:
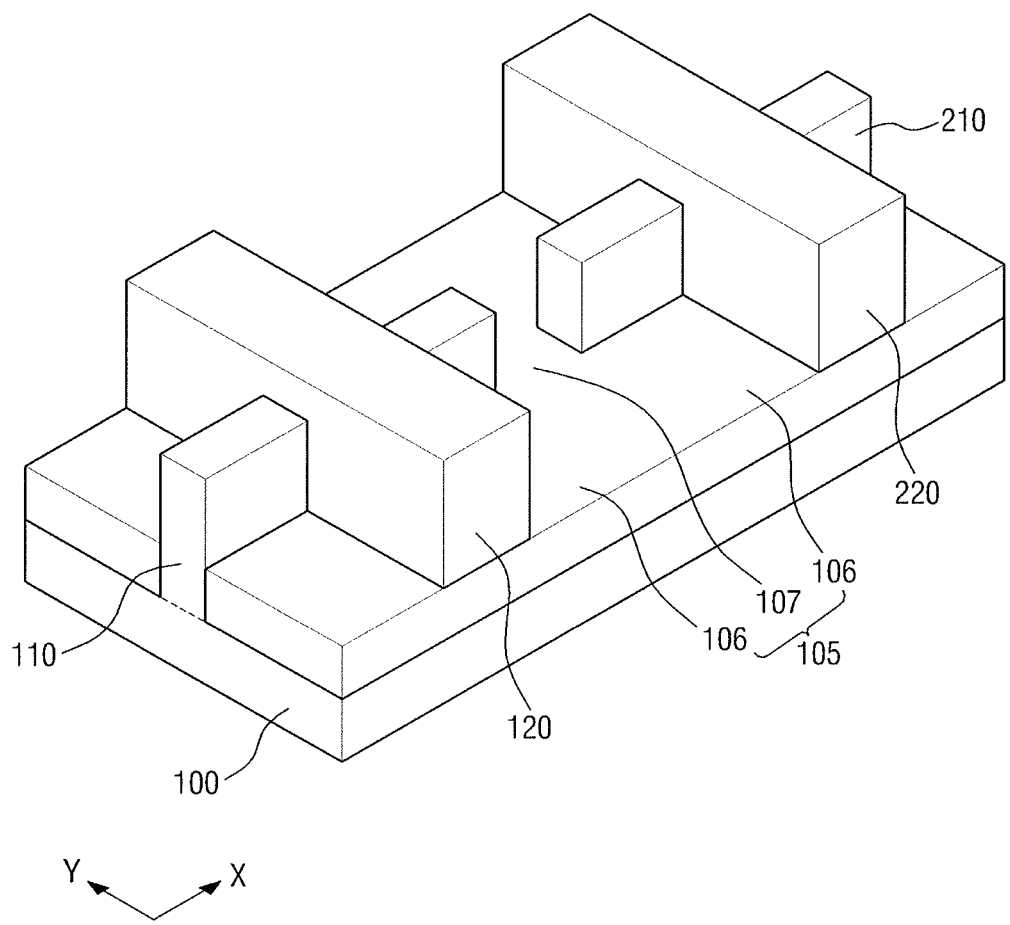
FIG. 3 is a perspective view for explaining a fin-shaped pattern and a field insulating layer of FIG. 2.
Figure 4:
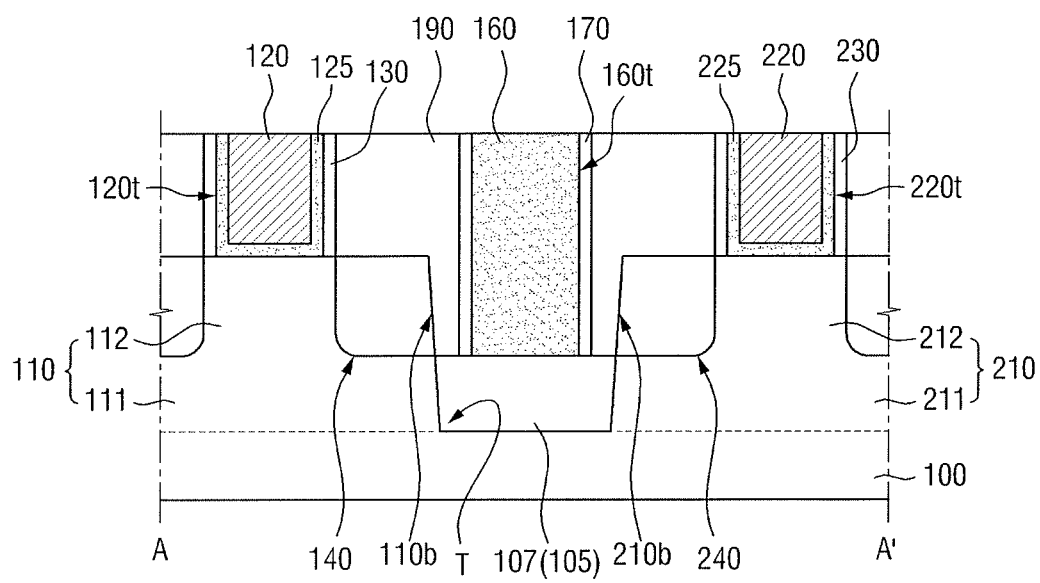
FIG. 4 is a cross-sectional view taken along line 4-4 of FIG. 2.
Figure 5A:
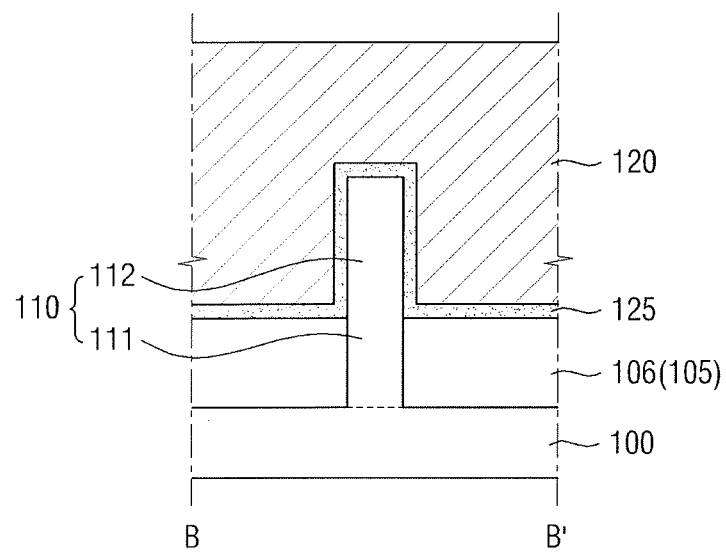
FIGS. 5A and 5B are cross sectional views taken along line 5-5 of FIG. 2.
Figure 5B:
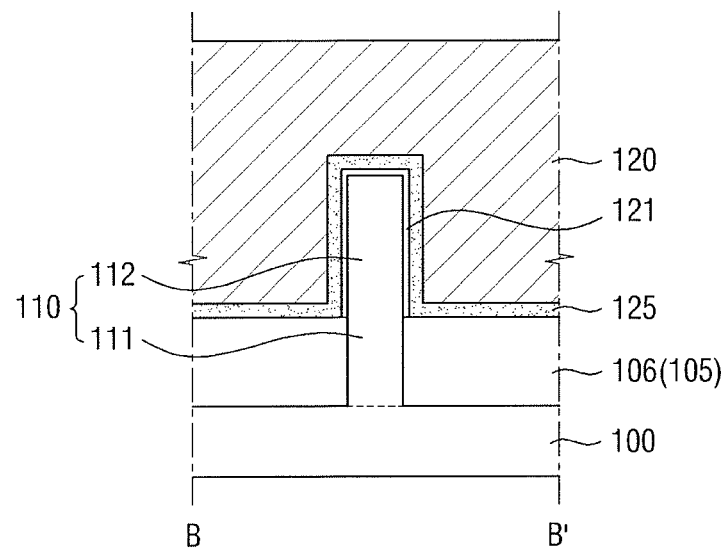

FIGS. 1 and 2 are a layout diagram and a perspective view for explaining a semiconductor device according to example embodiments, respectively. FIG. 3 is a perspective view for explaining a fin-shaped pattern and a field insulating layer of FIG. 2. FIG. 4 is a cross-sectional view taken along line 4-4 of FIG. 2. FIGS. 5A and 5B are cross sectional views taken along line 5-5 of FIG. 2.

A fin-shaped pattern shown in FIGS. 1 through 3 may include source/drain regions formed on or in the fin-shaped pattern. Further, although the fin-shaped pattern is exemplarily illustrated in drawings, the fin-shaped pattern may be substituted with a nanowire-shaped pattern.

Referring to FIGS. 1 through 5B, a semiconductor device 1 according to example embodiments may include a first fin-shaped pattern 110, a second fin-shaped pattern 210, a first gate electrode 120, a second electrode 220, and an insulating line pattern 160.

The substrate 100 may be, for example, a bulk silicon substrate, or a silicon-on-insulator (SOI) substrate. Alternatively, the substrate 100 may include, for example, silicon-germanium, indium antimonide, indium arsenide, indium phosphide gallium arsenide, gallium antimonide, or lead tellurium compound. Further, the substrate 100 may include a base substrate and an epitaxial layer formed thereon.

The first fin-shaped pattern 110 and the second fin-shaped pattern 210 may extend in a first direction X. The first fin-shaped pattern 110 and the second fin-shaped pattern 210 may extend in a line in a length direction of each of the first and second fin-shaped patterns 110 and 210. The first direction X may be parallel to the length direction of each of the first and second fin-shaped patterns 110 and 210. The first fin-shaped pattern 110 and the second fin-shaped pattern 210 may be arranged in a row in the first direction X.

Since the first and second fin-shaped patterns 110 and 210 are elongated in the first direction X, the first and second fin-shaped patterns 110 and 210 may have long sides 110a and 210a extending along the first direction X and short sides 110b and 210b extending along a second direction Y, respectively. The second direction Y may be perpendicular to the first direction X. The short side 110b of first fin-shaped pattern 110 may face the short side 210b of the second fin-shaped pattern 110 because the first and second fin-shaped patterns 110 and 210 are arranged in a row in the length direction. Although top surfaces of the first and second fin-shaped patterns 110 and 210 are rounded, it will be understood by those of ordinary skill in the art that the long sides and the short sides of the first and second fin-shaped patterns 110 and 210 can be distinguished.

The first and second fin-shaped patterns 110 and 210 may be formed to be immediately adjacent to each other. The first fin-shaped pattern 110 and the second fin-shaped pattern 210 may be separated by a separation trench T.

The separation trench T may be formed between the first fin-shaped pattern 110 and the second fin-shaped pattern 210. For example, the short side 110b of the first fin-shaped pattern 110 and the short side 210b of the second fin-shaped pattern 210 may be defined by the separation trench T.

The first and second fin-shaped patterns 110 and 210 may serve as an active pattern for a multi-gate transistor. For example, channels may be formed along three surfaces of each of the first and second fin-shaped patterns 110 and 210 such that the channels may be connected to each other, or channels may be formed on opposite surfaces of each of the first and second fin-shaped patterns 110 and 210.

The first and second fin-shaped patterns 110 and 210 may be a portion of substrate 100 or may include an epitaxial layer growing from the substrate 100.

The first and second fin-shaped patterns 110 and 210 may include silicon, germanium as a semiconductor element. In some embodiments, the first and second fin-shaped patterns 110 and 210 may include a semiconductor compound material (e.g., IV-IV group semiconductor compound or III-V group semiconductor compound).

The IV-IV group semiconductor compound, for example, may include a binary compound, a ternary compound, a binary compound doped with a group IV element, or a ternary compound doped with a group IV element, each of which contains at least two of carbon (C), silicon (Si), germanium (Ge), and tin (Sn).

The III-V group semiconductor compound, for example, may include a binary compound, a ternary compound, or a quaternary compound, each of which is formed by the combination of at least one group III element such as aluminum (Al), gallium (Ga) and indium (In) and at least one group V element such as phosphorus (P), arsenic (As) and antimony (Sb).

In semiconductor devices according to the embodiments, each of the first and second fin-shaped patterns 110 and 210 are described as a silicon fin-shaped active pattern.

A field insulating layer 105 may be formed on the substrate 100, and may be disposed around the first and second fin-shaped patterns 110 and 210. Accordingly, the first and second fin-shaped patterns 110 and 210 may be defined by the field insulating layer 105.

The field insulating layer 105 may include a first part 106 and a second part 107. The first part 106 of the field insulating layer 105 may be in contact with the long sides 110a and 210a of the first and second fin-shaped patterns 110 and 210, and may extend along the long sides 110a and 210a thereof, in the first direction X.

The second part 107 of the field insulating layer 105 may be in contact with the short sides 110b and 210b of the first and second fin-shaped patterns 110 and 210, and may be disposed between the first fin-shaped pattern 110 and the second fin-shaped pattern 210. The second part 107 of the field insulating layer 105 may fill a portion of the separation trench T between the firs fin-shaped pattern 110 and the second fin-shaped pattern 210.

A top surface of the field insulating layer 105 may be lower than the top surfaces of the first and second fin-shaped patterns 110 and 210. For example, top surfaces of the first and second part 106 and 107 of the field insulating layer 105 may be lower than the top surfaces of the first and second fin-shaped patterns 110 and 210. In other words, a height H1 of the first part 106 and a height H2 of the second part 107 of the first insulating layer 105 may be less than those of the first and second fin-shaped patterns 110 and 210 with respect to a bottom surface of the separating trench T.

The field insulating layer 105 may be formed to cover a portion of the first fin-shaped pattern 110 and a portion of the second fin-shaped pattern 210. The first fin-shaped pattern 110 may include a lower portion 111 and an upper portion 112, and the second fin-shaped pattern 210 may include a lower portion 211 and an upper portion 212. The field insulating layer 105 may cover the lower portions 111 and 211 of the first and second fin-shaped patterns 110 and 210. However, the field insulating layer 105 may not cover the upper portions 112 and 212 of the first and second fin-shaped patterns 110 and 210. Thus, the field insulating layer 105 may not be in contact with the upper portions 112 and 212 of the first and second fin-shaped patterns 110 and 210. As a result, the upper portions 112 and 212 of the first and second fin-shaped patterns 110 and 210 may protrude above the top surfaces of the first and second parts 106 and 107 of the field insulating layer 105.

The field insulating layer 105 may be, for example, an oxide layer, a nitride layer, an oxynitride layer, or a combination thereof.

An interlayer insulating layer 190 may be formed on the substrate 100. The interlayer insulating layer 190 may be disposed on the first and second fin-shaped patterns 110 and 210 and the field insulating layer 105. The interlayer insulating layer 190 may cover the upper portions 112 and 212 of the first and second fin-shaped patterns 110 and 210 and the field insulating layer 105. The interlayer insulating layer 190 may include a first trench 120t, a second trench 220t, and a third trench 160*t*. The first trench 120*t* may extend in the second direction Y to intersect the first fin-shaped pattern 110 and the second trench 220*t* may extend in the second direction Y to intersect the second fin-shaped pattern 210. The first trench 120*t* may expose a portion of the first fin-shaped pattern 110 and the second trench 220*t* may expose a portion of the second fin-shaped pattern 210. The third trench 160*t* may extend in the second direction Y between the first trench 120*t* and the second trench 220*t*. The third trench 160*t* may be formed to cross between the first fin-shaped pattern 110 and the second fin-shaped pattern 210. That is, the third trench 160*t* may extend in the second direction Y between the first fin-shaped pattern 110 and the second fin-shaped pattern 210. The third trench 160*t* may expose a portion of the top surface of the second part 107 of the field insulating layer layer 105.

The interlayer insulating layer 190 may include, for example, at least one of silicon oxide, silicon nitride, silicon oxynitride, and a low-k dielectric material. The low-k dielectric material for the interlayer insulating layer 190 may include, for example, flowable oxide (FOX), tonen silazen (TOSZ), undoped silica glass (USG), borosilica glass (BSG), phosphosilica glass (PSG), borophosphosilica glass (BPSG), plasma Enhanced Tetra Ethyl Ortho Silicate (PE-TEOS) oxide, fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK™ polyimide, porous polymeric material, and/or combinations thereof, but is not limited thereto.

The first gate electrode 120 may extend in the second direction Y and may be formed to cross the first fin-shaped pattern 110. The first gate electrode 120 may be in the first trench 120*t*. The first gate electrode 120 may be disposed on the first fin-shaped pattern 110 and the field insulating film 105. The first gate electrode 120 may cover the upper portion 112 of the first fin-shaped pattern 110, which protrudes above the field insulating layer 105

The second gate electrode 220 may extend in the second direction Y, and may be formed to cross the second fin-shaped pattern 210. The second gate electrode 220 may be in the second trench 220*t*. The second gate electrode 220 may be disposed on the second fin-shaped pattern 210 and the field insulating film 105. The second gate electrode 220 may cover the upper portion 212 of the second fin-shaped pattern 210, which protrudes above the field insulating layer 105

The first and second gate electrodes 120 and 220 may include, for example, at least one of poly-silicon, amorphous silicon, titanium (Ti), titanium nitride (TiN), tungsten nitride (WN), titanium aluminum (TiAl), titanium aluminum nitride (TiAlN), tantalum nitride (TaN), titanium carbide (TiC), tantalum carbide (TaC), tantalum carbon nitride (TaCN), tantalum silicon nitride (TaSiN), and combinations thereof, but are not limited thereto. The first and second gate electrodes 120 and 220 may be formed, for example, by a gate replacement process (or a gate last process), but are not limited thereto.

The insulating line pattern 160 may be formed on the second part 107 of the field insulating layer 105, and may extend in the second direction Y. The insulating line pattern 160 may be formed in the third trench 160*t* which exposes the top surface of the second part 107 of the field insulating layer 105.

The insulating line pattern 160 may cross (or pass through) between the first fin-shaped pattern 110 and the second fin-shaped pattern 210. For example, the insulating line pattern 160 may be disposed between the short side 110*b* of the first fin-shaped pattern 110 and the short side 210*b* of the second fin-shaped pattern 210. The insulating line pattern 160 may be spaced apart from the short sides 110*b* and 210*b* of the first and second fin-shaped patterns 110 and 210, and may not be in contact with the first and second fin-shaped patterns 110 and 210.

A sidewall of the third trench 160*t* in which the insulating line pattern 160 is formed may not be defined by the first and second fin-shaped patterns 110 and 210. The third trench 160*t* may be formed in the interlayer insulating layer 190.

A top surface of the insulating line pattern 160 may be substantially coplanar with those of the first and second gate electrodes 120 and 220. A top surface of the interlayer insulating layer 190 may be substantially coplanar with those of the first and second gate electrodes 120 and 220 and the insulating line pattern 160. The interlayer insulating layer 190 may cover the sidewalls of the first and second gate electrodes 120 and 220 and the insulating line pattern 160.

A height of the insulating line pattern 160 may be greater than a height of the upper portion 112 of the first fin-shaped pattern 110, and greater than a height of the upper portion 212 of the second fin-shaped pattern 210. The upper portions 112 ad 212 of the first and second fin-shaped patterns 110 and 210 may protrude above the top surface of the second part 107 of the field insulating layer 105.

A bottom surface of the insulating line pattern 160 may be lower than the top surface of the first fin-shaped pattern 110 and lower than the top surface of the second fin-shaped pattern 210. For example, the bottom surface of the insulating pattern 160 may be closer to the bottom surface of the separating trench T than to the top surface of the first fin-shaped pattern 110, and closer to the bottom surface of the separating trench T than to the top surface of the second fin-shaped pattern 210.

A width of a lower portion of the insulating line pattern 160 in the first direction X may be less than that of an upper portion of the second part 107 of the field insulating layer 105 in the first direction X.

The insulating pattern 160 may be in direct contact with the second part 107 of the field insulting layer 105. That is, the bottom surface of the insulating pattern 160 may be in direct contact with the top surface of the second part 107 of the field insulting layer 105. Thus, the height of the insulating pattern 160 may be substantially equal to that of the top surface of the interlayer insulating layer 190 covering the second part 107 of the field insulating layer 105.

The insulating line pattern 160 may include an insulating material. The insulating line pattern 160 may not include a conductive material. The insulating line pattern 160 may include, for example, at least one of silicon oxide, silicon nitride, silicon oxynitride, and a low-k dielectric material. The low-k dielectric material for the interlayer insulating layer 190 may include, for example, flowable oxide (FOX), tonen silazen (TOSZ), undoped silica glass (USG), borosilica glass (BSG), phosphosilica glass (PSG), borophosphosilica glass (BPSG), plasma Enhanced Tetra Ethyl Ortho Silicate (PETEOS) oxide, fluoride silicate glass (FSG), carbon doped silicon oxide (CDO), xerogel, aerogel, amorphous fluorinated carbon, organo silicate glass (OSG), parylene, bis-benzocyclobutenes (BCB), SILK, polyimide, porous polymeric material, and/or combinations thereof, but is not limited thereto.

A first gate insulating layer 125 may be formed between the first fin-shaped pattern 110 and the first gate electrode 120. The first gate insulating layer 125 may be formed along a profile of the first fin-shaped pattern 110 which protrudes above the field insulating layer 105. Further, the first gate insulating layer 125 may be disposed between the first gate electrode 120 and the first part 106 of the field insulating layer 105. The first gate insulating layer 125 may be formed along the sidewall and bottom surface of the first trench 120t.

A second gate insulating layer 225 may be formed between the second fin-shaped pattern 210 and the second gate electrode 220. The second gate insulating layer 225 may be formed along a profile of the second fin-shaped pattern 210 which protrudes above the field insulating layer 105. Further, the second gate insulating layer 225 may be disposed between the second gate electrode 220 and the first part 106 of the field insulating layer 105. The second gate insulating layer 225 may be formed along the sidewall and the bottom surface of the second trench 220t.

As shown in FIG. 5B, an interfacial layer 121 may further be formed between the first gate electrode 120 and the first gate insulating layer 125. Also, the interfacial layer 121 may further be formed between the second gate electrode 220 and the second gate insulating layer 225. Although not illustrated in FIG. 4, an interfacial layer 121 may further be formed between the first gate electrode 120 and the first gate insulating layer 125, and between the second gate electrode 220 and the second gate insulating layer 225.

Although the interfacial layer 121 is illustrated to be formed along a profile of the first fin-shaped pattern 110 protruding above the top surface of the field insulating layer 105 in FIG. 5B, the example embodiments are not limited thereto. In some embodiments, the interfacial layer 121 may extend along the top surface of the field insulating layer 105 (e.g., the top surface of the first part 106 of the field insulating layer 105).

The first and second gate insulating layers 125 and 225 may include silicon oxide, silicon oxynitride, silicon nitride, a high-k dielectric material, and/or a combination thereof. The high-k dielectric material for the first and second gate insulating layers 125 and 225 may include, for example, at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, Aluminum oxide, lead scandium tantalum oxide, and lead zinc niobate, but is not limited thereto.

A first spacer 130 may be formed on sidewalls of the first gate electrode 120 extending the second direction Y. The first gate insulating layer 125 may extend between the first spacer 130 and the sidewalls of the first gate electrode 120.

A second spacer 230 may be formed on sidewalls of the second gate electrode 220 extending the second direction Y. The second gate insulating layer 225 may extend between the second spacer 230 and the sidewalls of the second gate electrode 220.

A first liner 170 may be formed on sidewalls of the insulating line pattern 160 extending in the second direction Y. The first liner 170 may be formed in the interlayer insulating layer 190, and the third trench 160t may be defined by the first liner 170. For example, the sidewall of the third trench 160t may be defined by the first liner 170 in the interlayer insulating layer 190. The insulating line pattern 160 may be formed to fill the third trench 160t defined by the first liner 170.

The first liner 170 may not be formed between the bottom surface of the insulating line pattern 160 and the top surface of the second part 107 of the field insulating layer 105. The first liner 170 may not be in contact with the first and second fin-shaped patterns 110 and 210. The interlayer insulating layer 190 may be disposed between the first liner 170 and the shot sides 110b and 210b of the first and second fin-shaped patterns 110s and 210. That is, the first liner 170 may be disposed between the interlayer insulating layer 190 and the insulating line pattern 160.

The first liner 170 may be in contact with the top surface of the second part 107 of the field insulating layer 105. A height of the first liner 170 may be substantially equal to a thickness of the interlayer insulating layer 190 on the second part 107 of the field insulating layer 105. The first liner 170 may include material having an etch selectivity with respect to the insulating line pattern 160.

The first and second spacers 130 and 230 and the first liner 170 may include, for example, silicon oxide, silicon nitride, silicon oxynitride, silicon oxycarbonitride (SiOCN), and/or a combination thereof.

A first source/drain 140 may be formed in the first fin-shaped pattern at opposite sides of the first gate electrode 120. The first source/drain 140 may be formed between the first gate electrode 120 and the insulating line pattern 170. The first source/drain 140 may be formed by doping the upper portion 112 of the first fin-shaped pattern 110 with impurities.

A second source/drain 240 may be formed in the second fin-shaped pattern at opposite sides of the second gate electrode 220. The second source/drain 240 may be formed between the second gate electrode 220 and the insulating line pattern 170. The second source/drain 240 may be formed by doping the upper portion 212 of the second fin-shaped pattern 210 with impurities.

Figure 6:
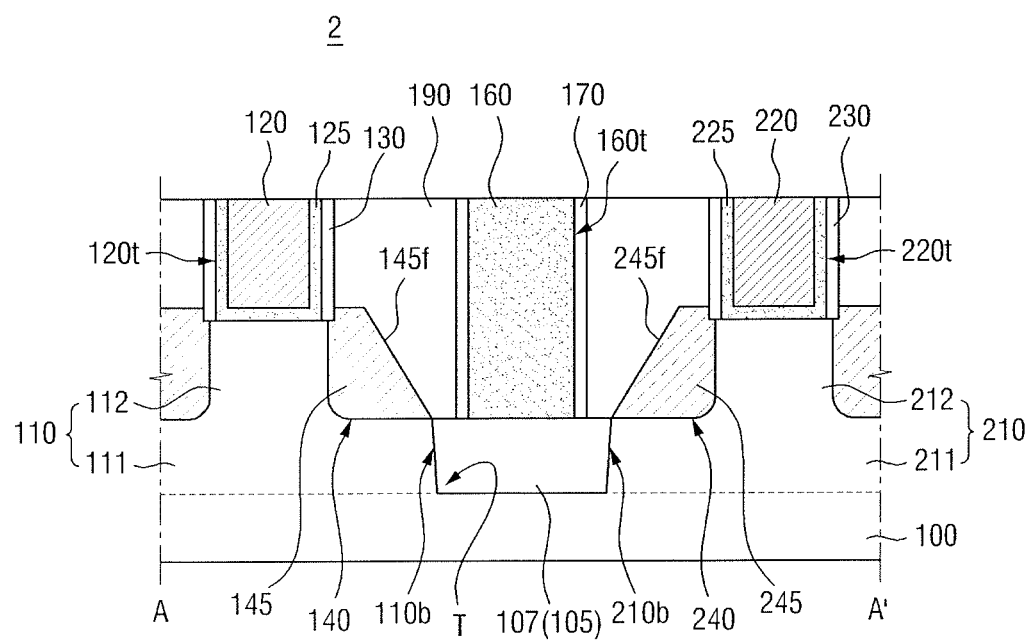
FIG. 6 is a cross-sectional view for explaining a semiconductor device according to example embodiments.

FIG. 6 is a cross-sectional view for explaining a semiconductor device according to example embodiments. FIG. 6 is a cross-sectional view taken along line 6-6 of FIG. 2. In present example embodiments, the same elements as described in the embodiments of FIGS. 1 through 5B will be indicated by the same reference numerals or the same reference designators.

Referring to FIG. 6, a semiconductor device 2 according to example embodiments may include a first source/drain 140 and a second source/drain 240 including a first epitaxial layer 145 and a second epitaxial layer 245, respectively. The first epitaxial layer 145 may be formed on the first fin-shaped pattern 110 and the second epitaxial layer 245 may be formed on the second fin-shaped pattern 210. The first epitaxial layer 145 may be formed to fill a recess in the upper portion 112 of the first fin-shaped pattern 110, and the second epitaxial layer 245 may be formed to fill a recess in the upper portion 212 of the second fin-shaped pattern 210.

Although the first epitaxial layer 145 formed at an end portion of the first fin-shaped pattern 110 and the second epitaxial layer 245 formed at an end portion of the second fin-shaped pattern 210 include a corresponding one of facets 145f and 245f, as shown in FIG. 6, the example embodiments are not limited thereto.

In a case where the semiconductor device 2 is a PMOS transistor, the first and second epitaxial layers 145 and 245 may include a compressive stress material. The compressive material may include a material having a lattice constant greater than that of silicon (Si). For example, the compressive material may be silicon germanium (SiGe). The compressive material may apply compressive stress to the first and second fin-shaped patterns 110 and 210 such that the carrier mobility in the channel region may be improved.

In a case where the semiconductor device 2 is an NMOS transistor, the first and second epitaxial layers 145 and 245 may include a tensile stress material. For example, when the first and second fin-shaped patterns 110 and 210 are silicon patterns, the first and second epitaxial layers 145 and 245 may include a material having a lattice constant less than that of silicon (Si). The tensile material may be, for example, silicon carbide (SiC). The tensile material may apply tensile stress to the first and second fin-shaped patterns 110 and 210 such that the carrier mobility in the channel region may be improved.

In some embodiments, in a case where the first gate electrode 120 and the second gate electrode 220 are included in a different type of a MOS transistor from each other, the first epitaxial layer 145 and the second epitaxial layer 245 may include a stress material different from each other. For example, in a case where the first gate electrode 120 is included in a PMOS transistor and the second gate electrode 220 is included in an NMOS transistor, the first epitaxial layer 145 may include a compressive stress material and the second epitaxial layer 245 may include a tensile stress material. But, in a case where the first gate electrode 120 is included in an NMOS transistor and the second gate electrode 220 is included in a PMOS transistor, the first epitaxial layer 145 may include a tensile stress material and the second epitaxial layer 245 may include a compressive stress material.

Figure 7:
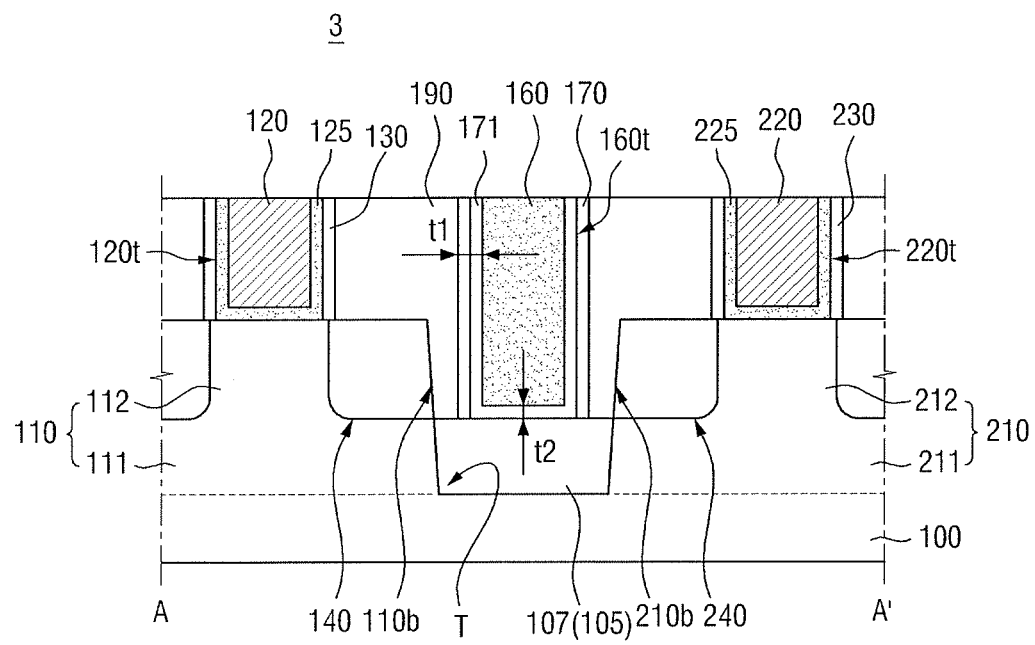
FIG. 7 is a cross-sectional view for explaining a semiconductor device according to example embodiments.

FIG. 7 is a cross-sectional view for explaining a semiconductor device according to example embodiments. FIG. 7 is a cross-sectional view taken along line 7-7 of FIG. 2. In present example embodiments, the same elements as described in the embodiments of FIGS. 1 through 5B will be indicated by the same reference numerals or the same reference designators.

Referring to FIG. 7, a semiconductor device 3 according to example embodiments may further include a second liner 171.

The second liner 171 may be formed along the sidewall and bottom surface of the third trench 160t. The second liner 171 may be formed along the sidewalls and the bottom surface of the insulating line pattern 160. The second liner 171 may be in direct contact with the second part 107 of the field insulating layer 105. The second liner 171 may include a first portion extending along the bottom surface of the third trench 160t and a second portion extending along the sidewall of the third trench 160t.

The first portion of the second liner 171 may be interposed between the insulating line pattern 160 and the second portion 107 of the field insulating layer 105. The first portion of the second liner 171 may extend along the top surface of the second part 107 of the field insulating layer 105.

The second portion of the second liner 171 may extend along the sidewalls of the insulating line pattern 160. The second portion of the second liner 171 may be interposed between the sidewalls of the insulating line pattern 160 and the first liner 170.

The insulating line pattern 160 may be formed to fill the third trench 160t with the second liner 171. Accordingly, the first and second liners 170 and 171 may be formed on the sidewalls of the insulating line pattern 160. The first liner 170 may not be formed under the bottom surface of the first liner 170, but the second liner 171 may be formed under the bottom surface of the insulating line pattern. As a result, a first thickness t1 of the liner (i.e., the first and second liners 170 and 171) on the sidewalls of the insulating line pattern 160 may be different from a second thickness t2 of the liner (i.e., the second liner 171) under the bottom surface of the insulating line pattern 160. For example, the first thickness t1 may be greater than the second thickness t2.

That is, the first thickness t1 of the liner (i.e., the first and second liners 170 and 171) protruding above the top surface of the second part 107 of the field insulating layer 105 may be greater than the second thickness t2 of the liner (i.e., the second liner 171) extending along the top surface of the second part 107 of the field insulating layer 105.

The second liner 171 may include, for example, silicon nitride (SiN), silicon oxynitride (SiON), silicon oxycarbonitride (SiOCN), and/or a combination thereof, but is not limited thereto.

Figure 8:
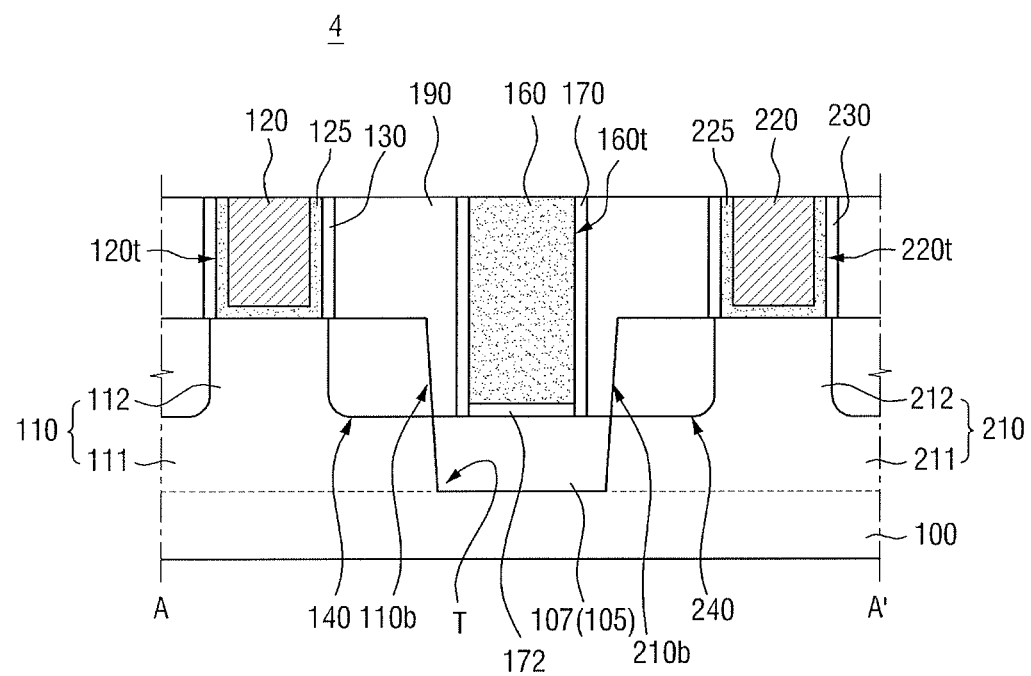
FIG. 8 is a cross-sectional view for explaining a semiconductor device according to example embodiments.

FIG. 8 is a cross-sectional view for explaining a semiconductor device according to example embodiments. FIG. 8 is a cross-sectional view taken along line 8-8 of FIG. 2. In present example embodiments, the same elements as described in the embodiments of FIGS. 1 through 5B will be indicated by the same reference numerals or the same reference designators.

Referring to FIG. 8, a semiconductor device 4 according to example embodiments may further include a third liner 172.

The third liner 172 may be formed only on the bottom surface of the third trench 160t. Thus, the third liner 172 may not be formed between the first liner 170 and the sidewalls of the insulating line pattern 160. The third liner 172 may be interposed between the bottom surface of the insulating line pattern 160 and the top surface of the second part 107 of the field insulating layer 105. The third liner 172 may contact the bottom surface of the insulating line pattern 160. The bottom surface of the insulating line pattern 160, which is in contact with the third liner 172, may be positioned at a lower level than the top surfaces of the first and second fin-shaped patterns 110 and 210. The third liner 172 may include, for example, silicon oxide, but is not limited thereto.

The second liner 171 described with reference to FIG. 7 may be formed on the third liner 172. The second liner 171 may be formed along the sidewall and bottom surface of the third trench 160t in which the third liner 172 may be formed.

Figure 9:
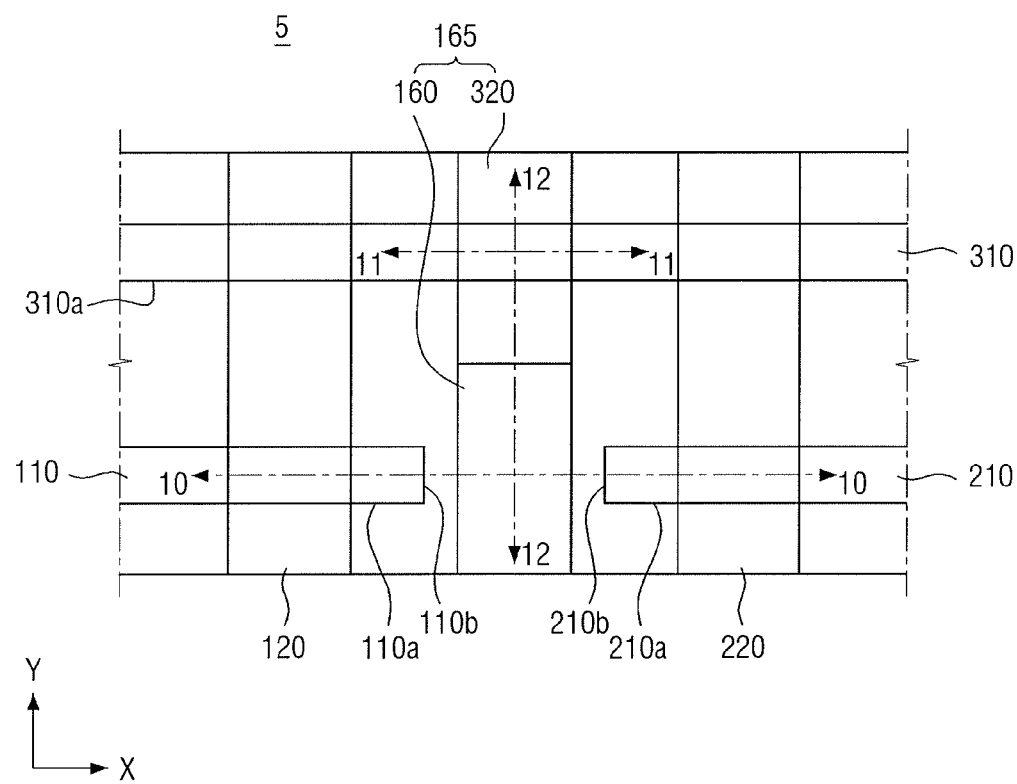
FIG. 9 is a layout diagram for explaining a semiconductor device according to example embodiments.
Figure 10:
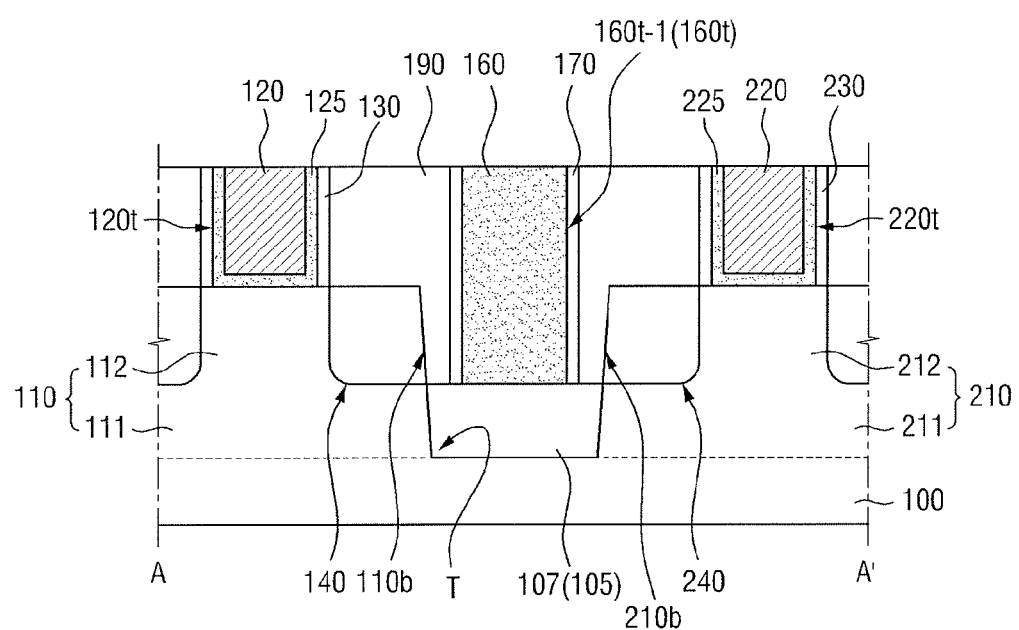
FIG. 10 is a cross-sectional view taken along line 10-10 of FIG. 9.
Figure 11:
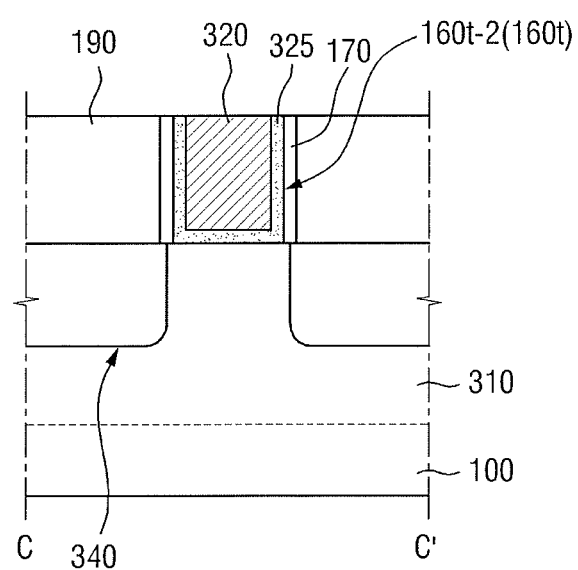
FIG. 11 is a cross-sectional view taken along line 11-11 of FIG. 9.
Figure 12:
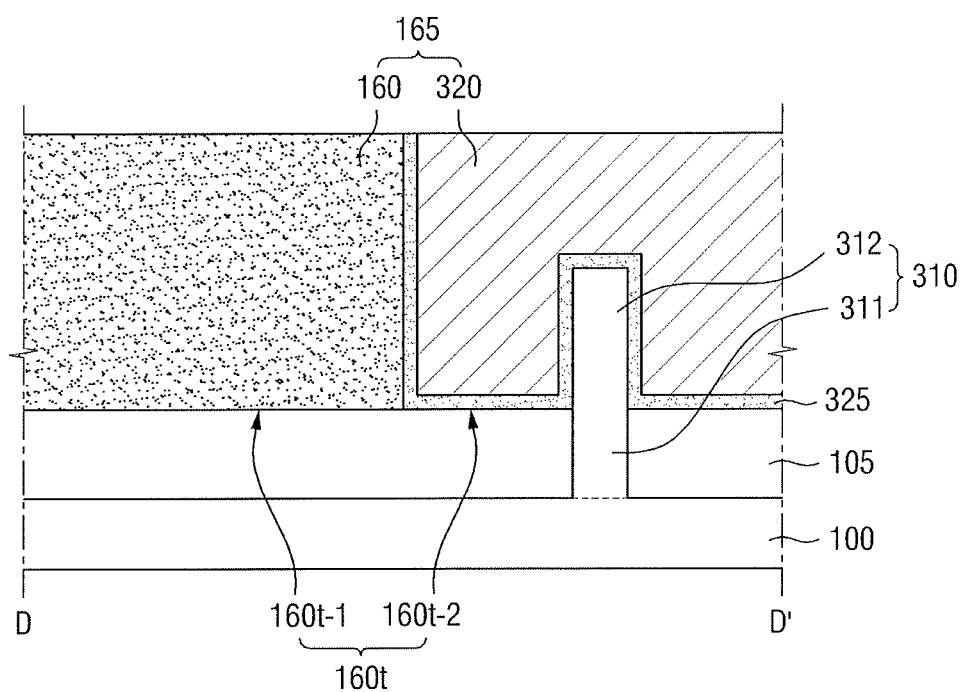
FIG. 12 is a cross-sectional view taken along line 12-12 of FIG. 9.

FIG. 9 is a cross-sectional view for explaining a semiconductor device according to example embodiments. FIG. 10 is a cross-sectional view taken along line 10-10 of FIG. 9. FIG. 11 is a cross-sectional view taken along line 11-11 of FIG. 9. FIG. 12 is a cross-sectional view taken along line 12-12 of FIG. 9. In present example embodiments, the same elements as described in the embodiments of FIGS. 1 through 5B will be indicated by the same reference numerals or the same reference designators.

Referring to FIGS. 9 through 12, a semiconductor device 5 according to example embodiments may include a first fin-shaped pattern 110, a second fin-shaped pattern 210, a third fin-shaped pattern 310, a first gate electrode 120, a second gate electrode 220, a field insulating layer 105, and a line pattern 165.

The third fin-shaped pattern 310 may be formed to extend in the first direction X. The first and second fin-shaped patterns 110 and 210 may extend in the first direction X. The first and second fin-shaped patterns 110 and 210 may be arranged in a row in the first direction X and may be spaced apart from each other. The first to third fin-shaped patterns 110, 210 and 310 may be arranged in the second direction Y.

A long side 110a of the first fin-shaped pattern 110 may face a long side 310a of the third fin-shaped pattern 310, and a long side 210a of the second fin-shaped pattern 210 may face the long side 310a of the third fin-shaped pattern 310.

The field insulating layer 105 may be formed around the third fin-shaped pattern 310. The field insulating layer 105 may cover a portion of the field insulating layer 105. The third fin-shaped pattern 310 may be defined by the field insulating layer 105. A top surface of the field insulating layer 105 which contacts the long side 310a of the third fin-shaped pattern 310 may be positioned at a lower level than a top surface of the third fin-shaped pattern 310. Descriptions of the third fin-shaped 310 may be substantially the same as or similar to those of the first and second fin-shaped patterns 110 and 210 shown in FIGS. 1 to 5B. Therefore, the description of the third fin-shaped pattern 310 will be omitted.

The line pattern 165 may be formed to extend in the second direction Y. The line pattern 165 may be formed on the third fin-shaped pattern 310 and the field insulating layer 105. The line pattern 165 may be formed in a third trench 160t. The line pattern 165 may be formed to cross the third fin-shaped pattern 310. The line pattern 165 may cross (or pass through) between the first fin-shaped pattern 110 and the second fin-shaped pattern 210. For example, the line pattern 165 may cross between a short side 110b of the first fin-shaped pattern 110 and a short side 210b of the second fin-shaped pattern 210.

The line pattern 165 may include a third gate electrode 320 and an insulating line pattern 160 which are laterally adjacent to each other (or which are stacked in the second direction Y). The third gate electrode 320 may cross the third fin-shaped pattern 310. The third gate electrode 320 may not pass through between the first fin-shaped pattern 110 and the second fin-shaped pattern 210.

The insulating line pattern 160 may not be formed on the third fin-shaped pattern 310. That is, the insulating line pattern 160 may not cross the third fin-shaped pattern 310. A bottom surface of the insulating line pattern 160 may be positioned at a lower level than the top surface of the third fin-shaped pattern 310. The insulating line pattern 160 may contact the top surface of the field insulating layer 105.

The third gate electrode 320 may extend in the second direction Y to cross the third fin-shaped pattern 310. The third gate electrode 320 may be formed on the third fin-shaped pattern 310 and the field insulating layer 105. The third gate electrode 320 may cover a portion of the third fin-shaped pattern 310, which protrudes above the top surface of the field insulating layer 105, for example, an upper portion 312 of the third fin-shaped pattern 310.

The third gate electrode 320 may include, for example, poly-silicon, amorphous silicon, titanium (Ti), titanium nitride (TiN), tungsten nitride (WN), titanium aluminum (TiAl), titanium aluminum nitride (TiAlN), tantalum nitride (TaN), titanium carbide (TiC), tantalum carbide (TaC), tantalum carbon nitride (TaCN), tantalum silicon nitride (TaSiN), and/or a combination thereof, but is not limited thereto.

Although the first and second gate electrodes 120 and 220 may be illustrated to cross the third fine-shaped pattern 310 in FIG. 9, the example embodiments are not limited thereto.

As described above, the line pattern 165 (i.e., the third gate electrode 320 and the insulating line pattern 160) may be formed in the third trench 160t. The third trench 160t may include a first portion 160t-1 and a second portion 160t-2. The first portion 160t-1 of the third trench 160t may include a portion between the short side 110b of the first fin-shaped pattern 110 and the short side 210b of the second fin-shaped pattern 210, and the second portion 160t-2 of the third trench 160t may cross and expose the third fin-shaped pattern 310. Here, the insulating line pattern 160 may be formed to fill the first portion 160t-1 and the third gate electrode 320 may be formed to fill the second portion 160t-2.

A third gate insulating layer 325 may be formed between the third fin-shaped pattern 310 and the third gate electrode 320. The third gate insulating layer 325 may be formed along a profile of the third fin-shaped pattern 310 protruding above the top surface of the field insulating layer 105. Further, the third gate insulating layer 325 may be disposed between the field insulating layer 105 and the third gate electrode 320. The third gate insulating layer 325 may be formed along a sidewall and a bottom surface of the second portion 160t-2 of the third trench 160t.

The third gate insulating layer 325 may include a portion extending along a sidewall of the insulating line pattern 160, which faces a sidewall of the third gate electrode 320 in the second direction Y. For example, the portion of the third gate insulating layer 325 may be formed between the third gate electrode 320 and the insulating line pattern 160, and may be in direct contact with the insulating line pattern 160. The third gate insulating layer 325 may not extend between the bottom surface of the insulating line pattern 160 and the top surface of the field insulating layer 105.

Therefore, the third gate insulating layer 325 may define the second portion 160t-2 of the third trench 160t in which the third gate electrode 320 may be formed.

The third gate insulating layer 325 may include, for example, silicon oxide, silicon oxynitride, silicon nitride, a high-k dielectric material, and/or a combination thereof. The high-k dielectric material for the third gate insulating layer 325 may include, for example, at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, Aluminum oxide, lead scandium tantalum oxide, and lead zinc niobate, but is not limited thereto.

A first liner 170 may be formed to extend to the sidewall of the third gate electrode 325. A third source/drain 340 may be formed at opposite sides of the third gate electrode 320. The third source/drain 340 may be formed by doping the third fin-shaped pattern 310 at the opposite sides of the third gate electrode 320 with impurities.

Figure 13:
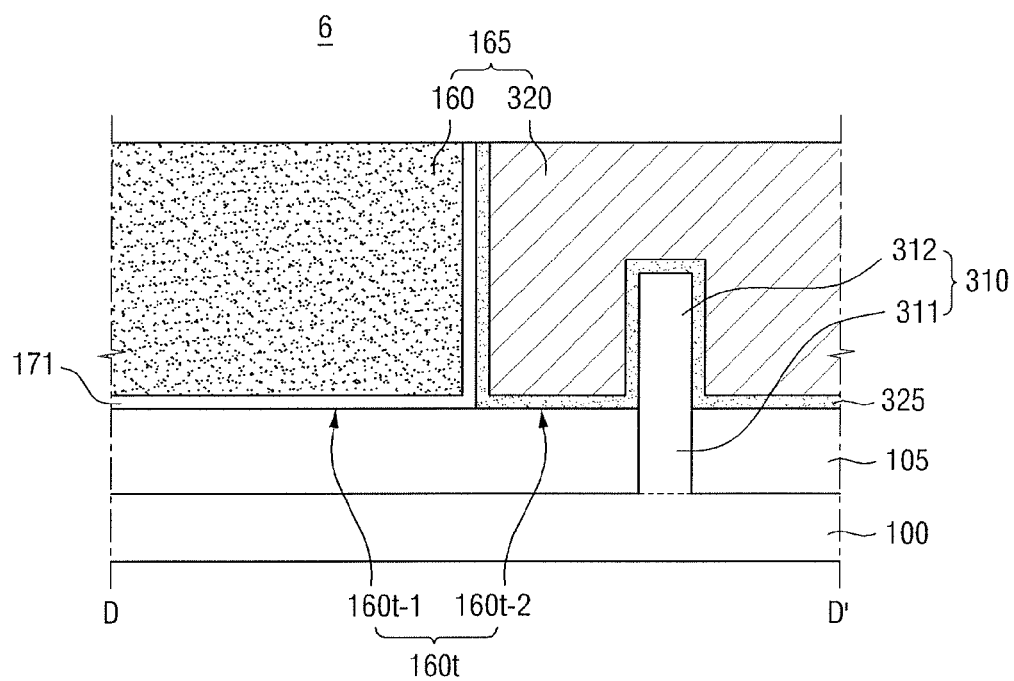
FIG. 13 is a cross-sectional view for explaining a semiconductor device according to example embodiments.

FIG. 13 is a cross-sectional view for explaining a semiconductor device according to example embodiments. FIG. 13 is a cross-sectional view taken along line 13-13 of FIG. 9. In present example embodiments, the same elements as described in the embodiments of FIGS. 9 through 12 will be indicated by the same reference numerals or the same reference designators.

Referring to FIG. 13, a semiconductor device 6 according to example embodiments may further include a second liner 171.

The second liner 171 may be formed along a sidewall and a bottom surface of the first portion 160t-1 of the third trench 160t. That is, the second liner 171 may be formed along the sidewall and the bottom surface of the insulating line pattern 160.

The second liner 171 may include a portion extending along the sidewall of the insulating line pattern 160, which faces the sidewall of the third gate electrode 320 in the second direction Y. A portion of the second liner 171 may be formed between the sidewall of the third gate electrode 320 and the sidewall of the insulating line pattern 160, which face each other. The portion of the second liner 171 may be formed between the sidewall of the third gate insulating layer 325 and the sidewall of the insulating line pattern 160 that faces the sidewall of the third gate electrode 320. The portion of the second liner 171 may be in direct contact with the third gate insulting layer 325.

Further, the second liner 171 may be formed to extend between the bottom surface of the insulating line pattern 160 and the top surface of the field insulating layer 105. The second liner 171 may not extend between the bottom surface of the gate electrode 320 and the top surface of the field insulating layer 105.

Therefore, the second liner 171 may define the first portion 160t-1 of the third trench 160t in which the insulating line pattern 160 may be formed.

FIGS. 14 through 23 are views for explaining a method of fabricating a semiconductor device according to example embodiments.

Figure 14:
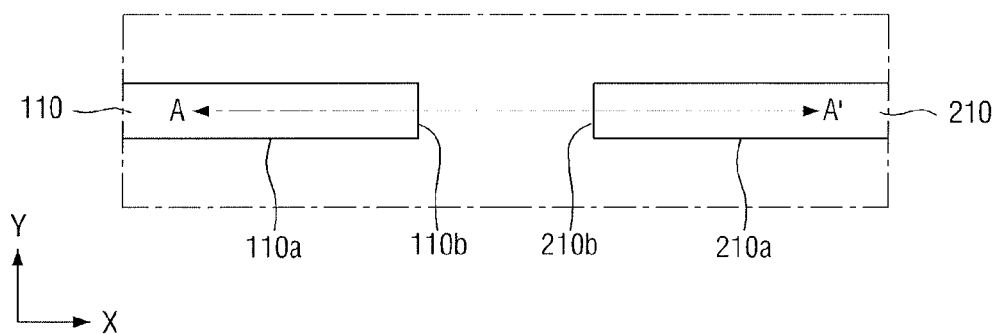
FIGS. 14 through 23 are cross-sectional views for explaining a method of fabricating a semiconductor device according to example embodiments.
Figure 15:
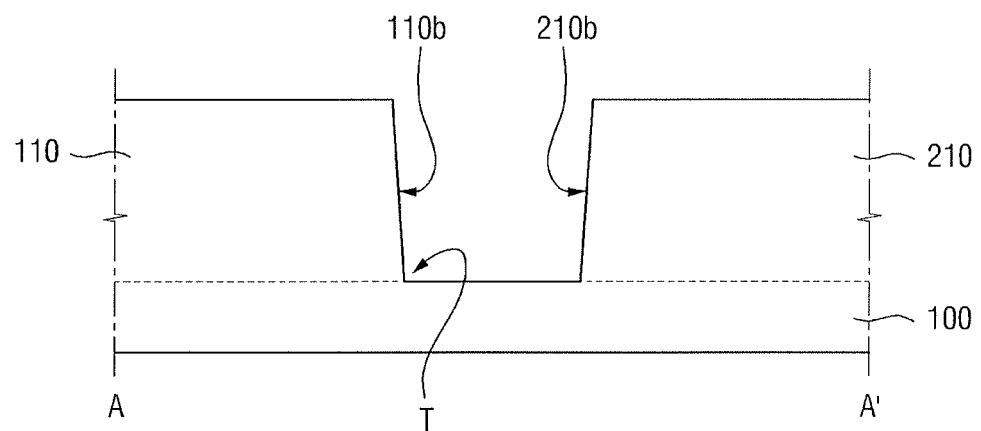

Referring to FIGS. 14 and 15, a first fin-shaped pattern 110 and a second fin-shaped pattern 210 may be formed on a substrate 100 and may extend in a first direction X. The first direction X may be parallel to a length direction of each of the first and second fin-shaped patterns 110 and 210. The first and second fin-shaped patterns 110 and 210 may have long sides 110a and 210a extending along the first direction X, respectively, and may have short sides 110b and 210b extending along a second direction Y across the first direction X, respectively. The first and second fin-shaped patterns 110 and 210 may be arranged in a row in the first direction X. A separation trench T may be formed between the first fin-shaped pattern 110 and the second fin-shaped pattern 210 to separate from each other.

Although top surfaces of the first and second fin-shaped patterns 110 and 210 are exposed as shown in drawings, the example embodiments are not limited thereto. For example, a mask pattern used in process of forming the first and second fin-shaped patterns 110 and 210 may remain on the first and second fin-shaped patterns 110 and 210.

Hereinafter, processes of fabricating the semiconductor device according to the example embodiments will be described based on cross-sectional views taken along line A-A' of FIG. 14.

Figure 16:
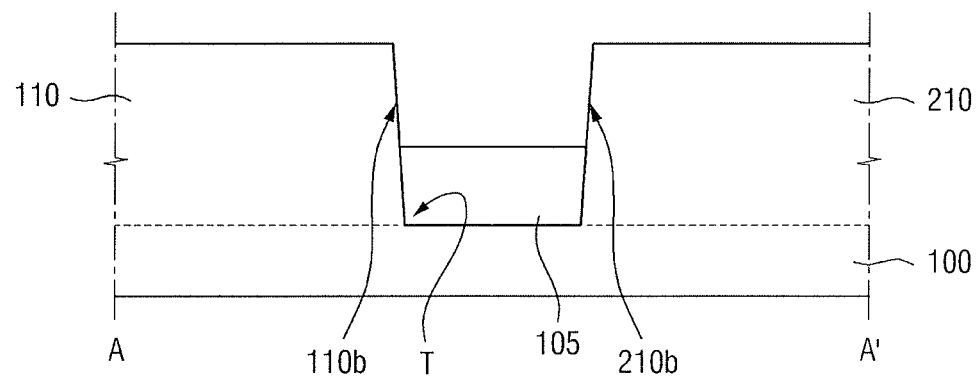

Referring to FIG. 16, a field insulating layer 105 may be formed to cover a portion of each of the first and second fin-shaped patterns 110 and 210. The field insulating layer 105 may fill a portion of the separation trench T.

A doping process for controlling a threshold voltage may be performed on the first and second fin-shaped patterns 110 and 210, but the example embodiments are not limited thereto.

Figure 17:
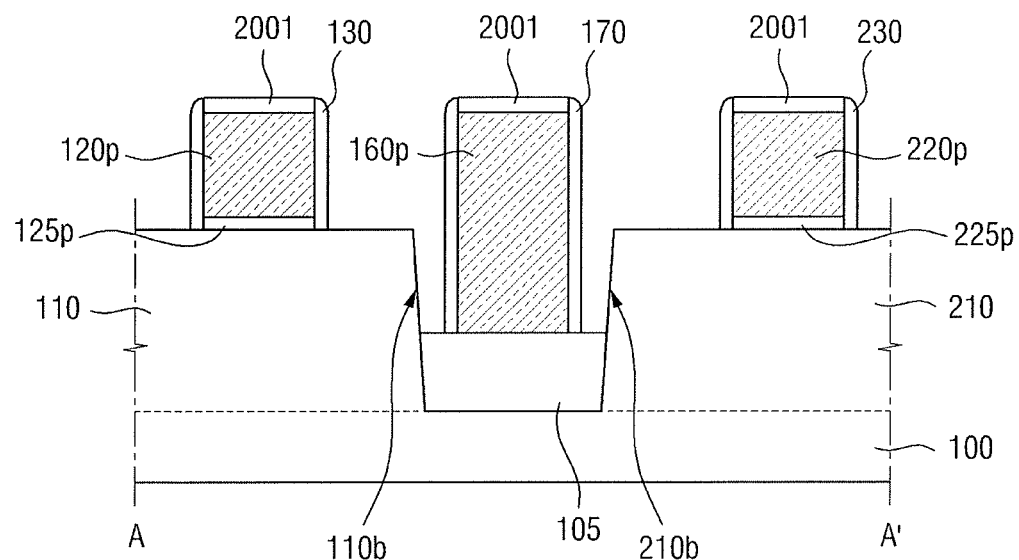

Referring to FIG. 17, a first dummy gate electrode 120p, a second dummy gate electrode 220p, and a third dummy gate electrode 160p may be formed on the substrate 100. A first mask pattern 2001 may be formed on the first to third dummy gate electrodes 120p, 220p, and 160p.

The first dummy gate electrode 120p may be formed on the first fin-shaped pattern 110 and may extend in the second direction Y. A first dummy gate insulating layer 125p may be formed between the first dummy gate electrode 120p and the first fin-shaped pattern 110.

The second dummy gate electrode 220p may be formed on the second fin-shaped pattern 210 and may extend in the second direction Y. A second dummy gate insulating layer 225p may be formed between the second dummy gate electrode 220p and the second fin-shaped pattern 210.

The third dummy gate electrode 160p may be formed between the first fin-shaped pattern 110 and the second fin-shaped pattern 210, and may extend in the second direction Y. The third dummy gate electrode 160p may be formed on the field insulating layer 105 between the short side 110b of first fin-shaped pattern 110 and the short side 210b of the second fin-shaped pattern 210. A width of a lower portion of the third dummy gate electrode 160p in the first direction X may be less than that of an upper portion of the field insulating layer 105 between the short side 110b of the first fin-shaped pattern 110 and the short side 210b of the second fin-shaped pattern 210 in the first direction X.

For the convenience of explanation, a third dummy gate insulating layer may not be illustrated in drawings, but is not limited thereto. For example, the third dummy gate insulating layer may be formed between the third dummy gate electrode 160p and the field insulating layer 105 according to a process of forming the first and second dummy gate insulating layers 125p and 225p.

The first to third dummy gate electrodes 120p, 220p and 160p may be formed, for example, of polycrystalline silicon or amorphous silicon, but are not limited thereto.

Next, a first spacer 130, a second spacer 230, and a first liner 170 may be formed on sidewalls of the first dummy gate electrode 120p, the second dummy gate electrode 220p, and the third dummy gate electrode 160p, respectively.

Figure 18:
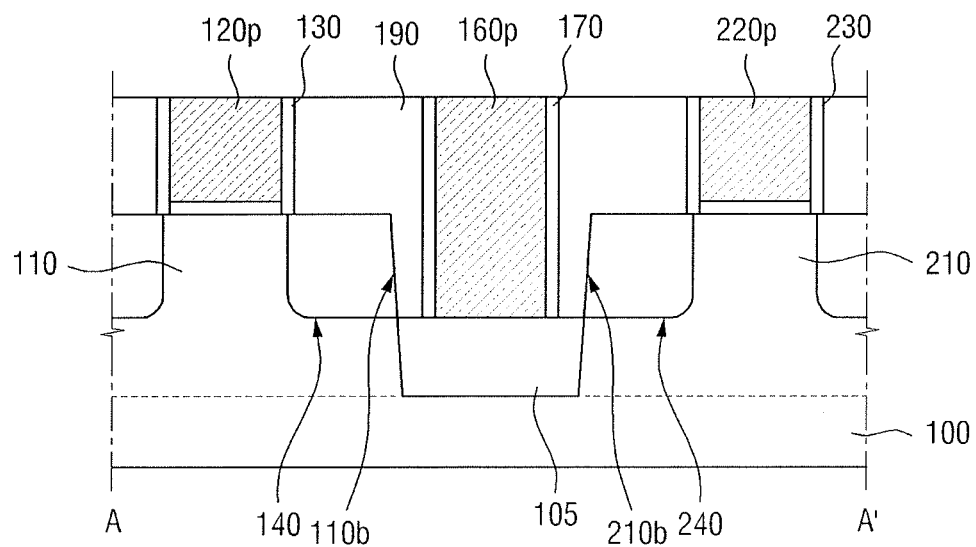

Referring to FIG. 18, a first source/drain region 140 may be formed in the first fin-shaped pattern 110 at opposite sides of the first dummy gate electrode 120p. A second source/drain region 240 may be formed in the second fin-shaped pattern 210 at opposite sides of the second dummy gate electrode 220p.

Each of the first and second source/drain regions 140 and 240 may include an epitaxial layer as described with reference to FIG. 6.

An interlayer insulating layer 190 may be formed on substrate 100. The interlayer insulating layer 190 may cover the field insulating layer 105, the first and second fin-shaped patterns 110 and 210, and the first to third dummy gate electrodes 120p, 220p, and 160p. The interlayer insulating layer 190 may be planarized until top surfaces of the first to third dummy gate electrodes 120p, 220p, and 160p may be exposed. Thus, the first mask pattern 2001 may be removed.

Figure 19:
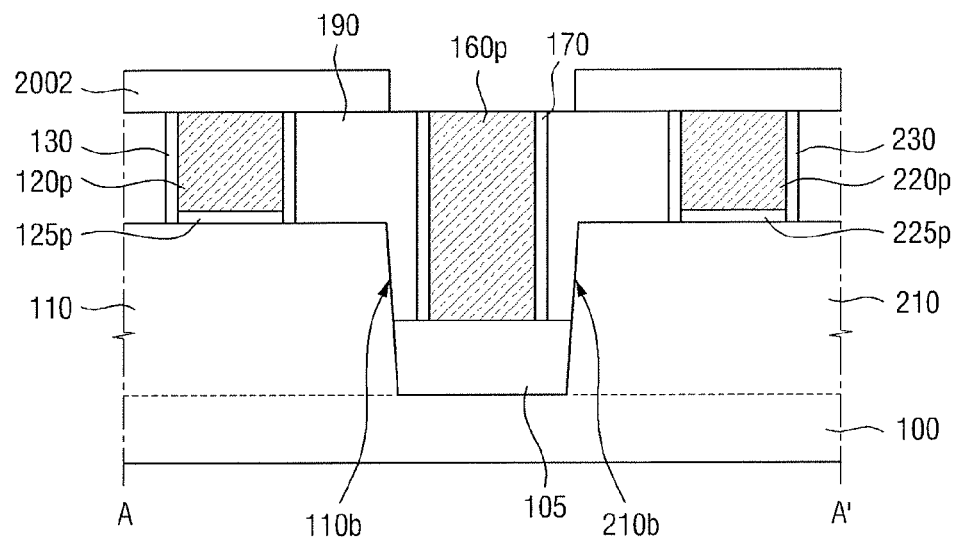

Referring to FIG. 19, a second mask pattern 2002 may be formed on the interlayer insulating layer 190. The second mask pattern 2002 may cover the top surfaces of the first and second dummy gate electrodes 120p and 220p, and may expose the top surfaces of the third dummy gate electrode 160p and the first liner 170.

Figure 20:
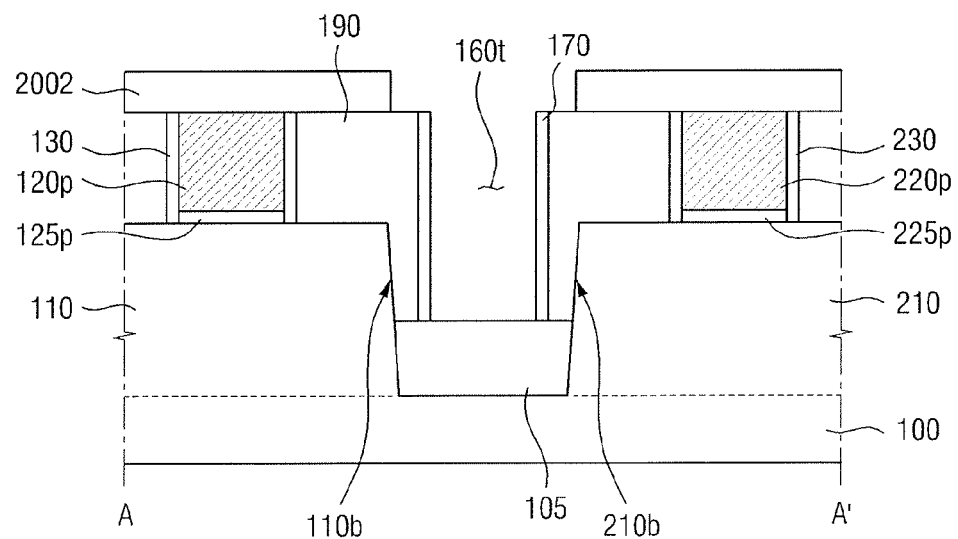

Referring to FIG. 20, the third dummy gate electrode 160p may be removed using the second mask pattern 2002 as an etch mask. Therefore, a third trench 160t which exposes a top surface of the field insulating layer 105 may be formed in the interlayer insulating layer 190. The third trench 160t may be defined by the first liner 170.

Figure 21:
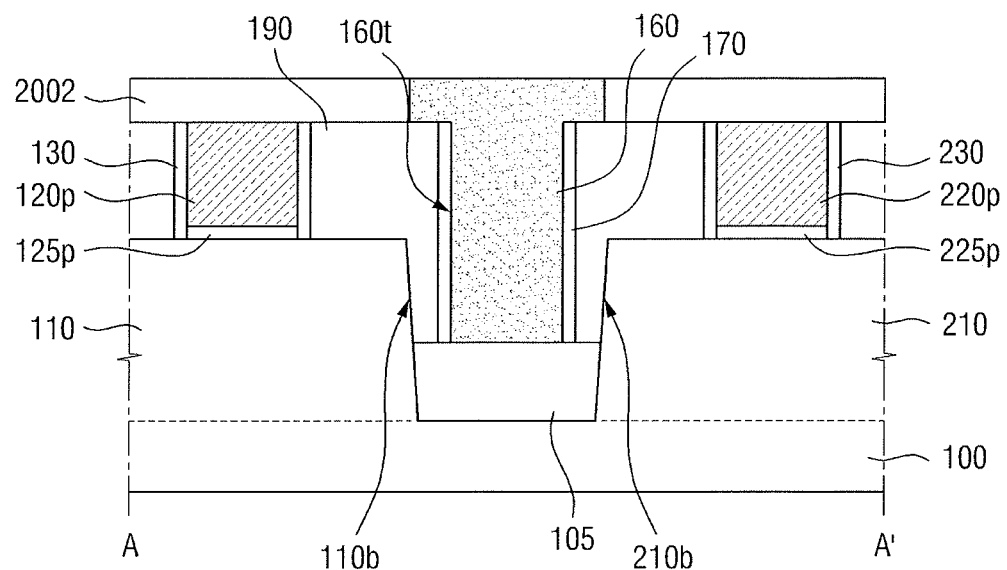

Referring to FIG. 21, an insulating line pattern 160 may be formed on the field insulting layer 105 and may fill the third trench 160t. The formation of the insulating line pattern 160 may include forming an insulating line layer covering the second mask pattern 2002 while filling the third trench 160 and planarizing the insulating line layer until the second mask pattern 2002 is exposed.

Figure 22:
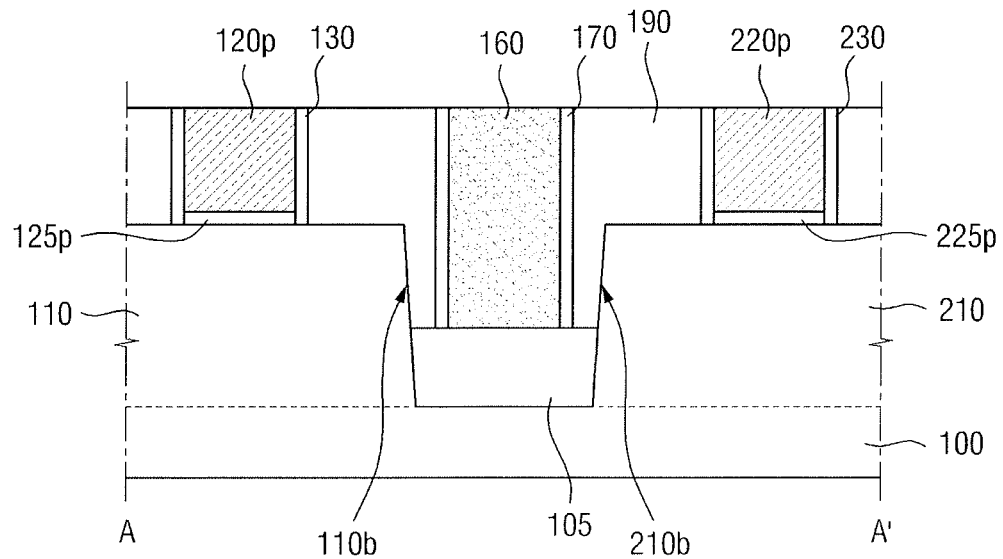

Referring to FIG. 22, a top surface of the interlayer insulating layer 190 may be exposed by removing the second mask pattern 2002. Thus, the top surfaces of the first and second dummy gate electrodes 120p and 220p may be exposed. When the second mask pattern 2002 is removed, a portion of the insulating line pattern 160 may be removed such that a top surface of the insulating line pattern 160 may be substantially coplanar with the top surface of the interlayer insulating layer 190.

Figure 23:
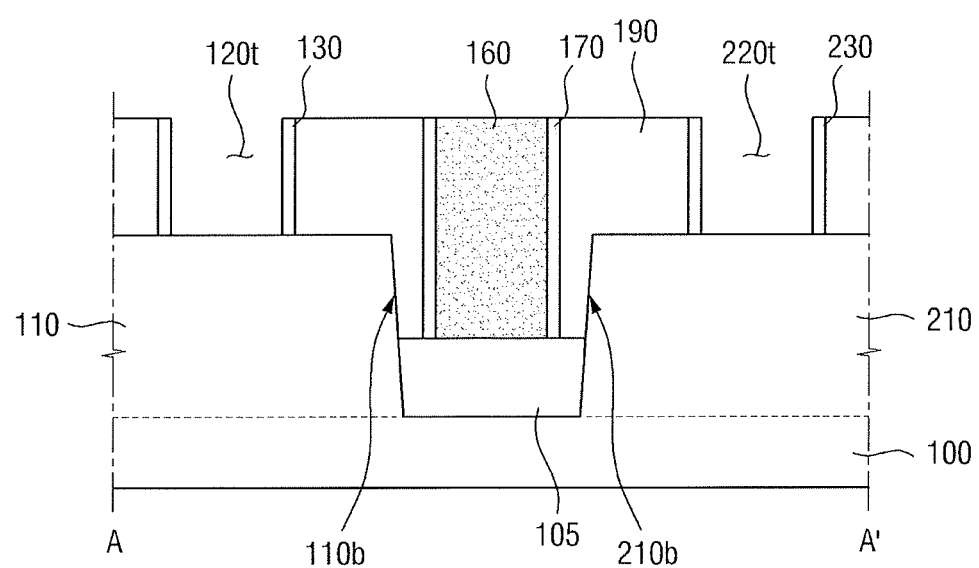

Referring to FIG. 23, the first and second dummy gate electrodes 120p and 220p may be removed. Further, the first and second gate insulating layers 125p and 225p may be removed.

A first trench 120t exposing the first fin-shaped pattern 110 may be formed in the interlayer insulating layer 190 by removing the first dummy gate electrode 120p and the first dummy gate insulating layer 125p. A second trench 220t exposing the second fin-shaped pattern 210 may be formed in the interlayer insulating layer 190 by removing the second dummy gate electrode 220p and the second dummy gate insulating layer 225p.

Referring back to FIG. 4, a first gate electrode 120 filling the first trench 120t may be formed on the first fin-shaped pattern 110, and a second gate electrode 220 filling the second trench 220t may be formed on the second fin-shaped pattern 210. The first and second gate electrodes 120 and 220 may cross the first and second fin-shaped patterns 110 and 210, respectively, and may extend in the second direction Y.

Figure 24:
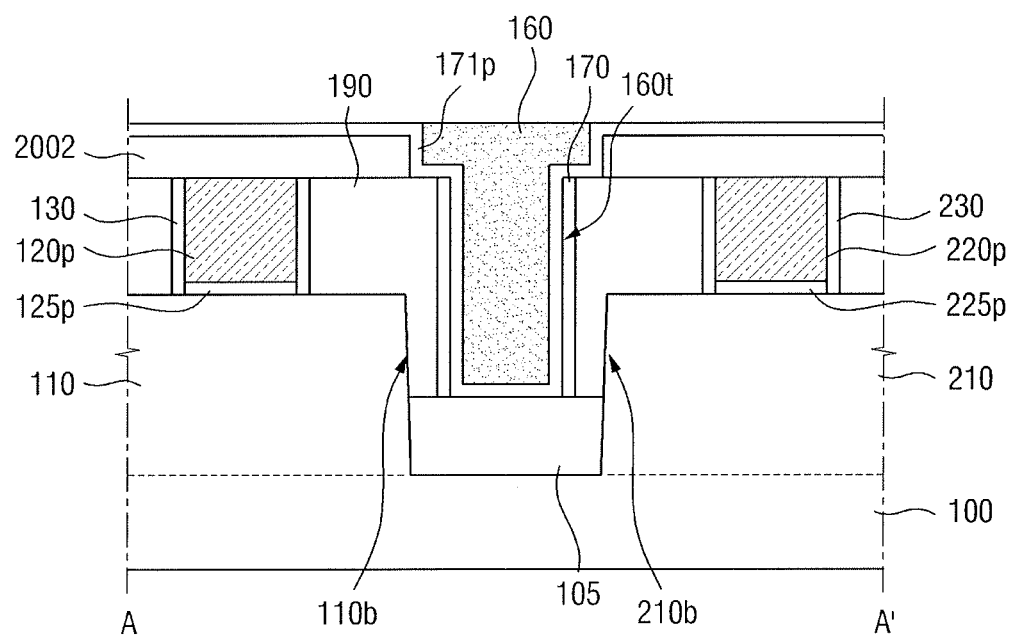
FIG. 24 is a cross-sectional view for explaining a method of fabricating a semiconductor device according to other example embodiments.

FIG. 24 is a cross-sectional view illustrating a process of fabricating a semiconductor device according to example embodiments. FIG. 24 is a view for explaining a process which proceeds after FIG. 20.

Referring to FIG. 24, a liner layer 171p may be formed along a sidewall and a bottom surface of the third trench 160t and a top surface of the second mask pattern 2002. After forming the liner layer 171p, an insulating pattern 160 filling the third trench 160t may be formed.

For example, an insulating line layer filling the third trench 160t in which the liner 171p is formed may be formed to cover the top surface of the second mask pattern 2002, and may be planarized until the liner layer 171p is exposed. Next, the second mask pattern 2002 and a portion of the liner layer 171p may be removed such that top surfaces of the first and second dummy gate electrodes 120p and 220p may be exposed. As a result, a second liner 171 may be formed along the sidewall and bottom surface of the third trench 160t, as shown in FIG. 7.

Figure 25:
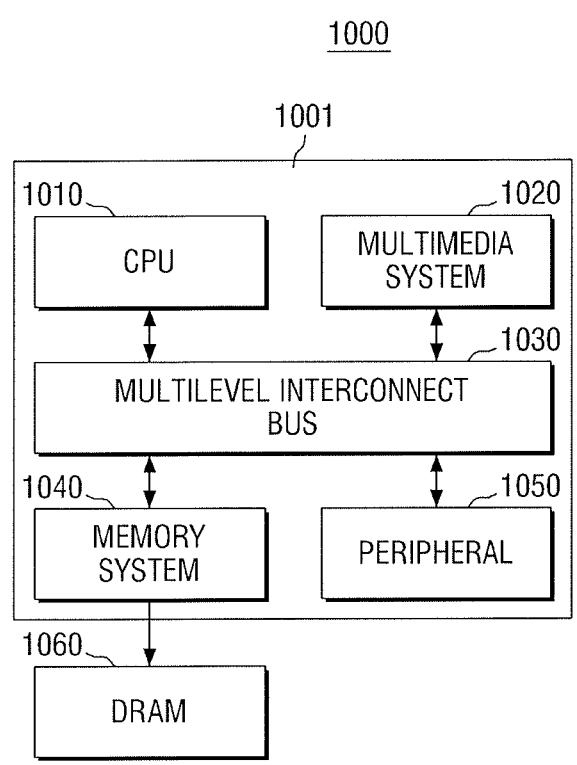
FIG. 25 is a block diagram of a system on chip (SoC) including semiconductor devices according to example embodiments.

FIG. 25 is a block diagram of a SoC 1000 including semiconductor devices according to example embodiments.

Referring to FIG. 25, the SoC 1000 may include application processor 1001 and dynamic random access memory (DRAM) 1060.

The application processor 1001 may include a central processing unit 1010, a multimedia system 1020, a bus 1030, a memory system, a peripheral circuit 1050.

The central processing unit 1010 may perform operations necessary for operating the SoC 1000. In some embodiments, the central processing unit 1010 may be configured in a multi-core environment including a plurality of cores.

The multimedia system 1020 may be used in performing a variety of multimedia functions in the SoC 1000. The multimedia system 1020 may include a 3D engine module, a video codec, a display system, a camera system, and a post-processor.

The bus 1030 may be used in performing data communication among the central processing unit 1010, the multimedia system 1020, the memory system 1040, and the peripheral circuit 1050. In some embodiments, the bus 1030 may have a multi-layered structure. In detail, examples of the bus 1030 may include a multi-layer advanced high-performance bus (AHB), or a multi-layer advanced eXtensible interface (AXI), but aspects are not limited thereto.

The memory system 1040 may provide environments necessary for high-speed operation by connecting the AP 1001 to an external memory (for example, the DRAM 1060). In some embodiments, the memory system 1040 may include a separate controller (for example, a DRAM controller) for controlling the external memory (for example, the DRAM 1060).

The peripheral circuit 1050 may provide environments necessary for smoothly connecting the SoC 1000 to an external device (for example, a main board). Accordingly, the peripheral circuit 1050 may include various kinds of interfaces enabling the external device connected to the SoC 1000 to be compatibly used.

The DRAM 1060 may function as a working memory required to operate the AP 1001. In some embodiments, as shown, the DRAM 1060 may be disposed outside the AP 1001. In detail, the DRAM 1060 may be packaged with the AP 1001 in the form of a package on package (PoP). Each of the central processing unit 1010, the multimedia system 1020 the memory system 1040, the peripheral circuit 1050 and DRAM 1060 may be embodied by one or more semiconductor devices described herein according to some example embodiments.

Figure 26:
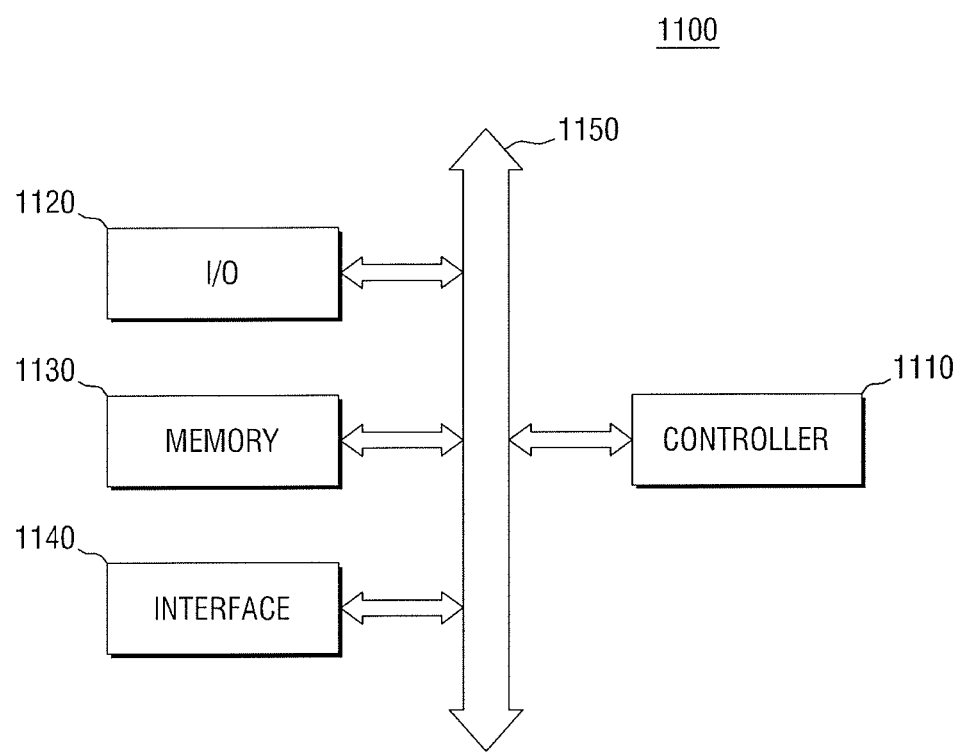
FIG. 26 is a block diagram of an electronic system including semiconductor devices according to example embodiments.

FIG. 26 is a block diagram of an electronic system including semiconductor devices according to example embodiments.

Referring to FIG. 26, the electronic system 1100 may include a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of performing functions similar to those of these elements. The I/O 1120 may include a key pad, a key board, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on. Although not shown, the electronic system 1100 may further include a high-speed DRAM and/or static random access memory (SRAM) as the working memory for improving the operation of the controller 1110. Here, one or more semiconductor devices described herein according to some example embodiments may be provided in the memory device 1130 or may be provided some components of the controller 1110 or the I/O 1120.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment.

Figure 27:
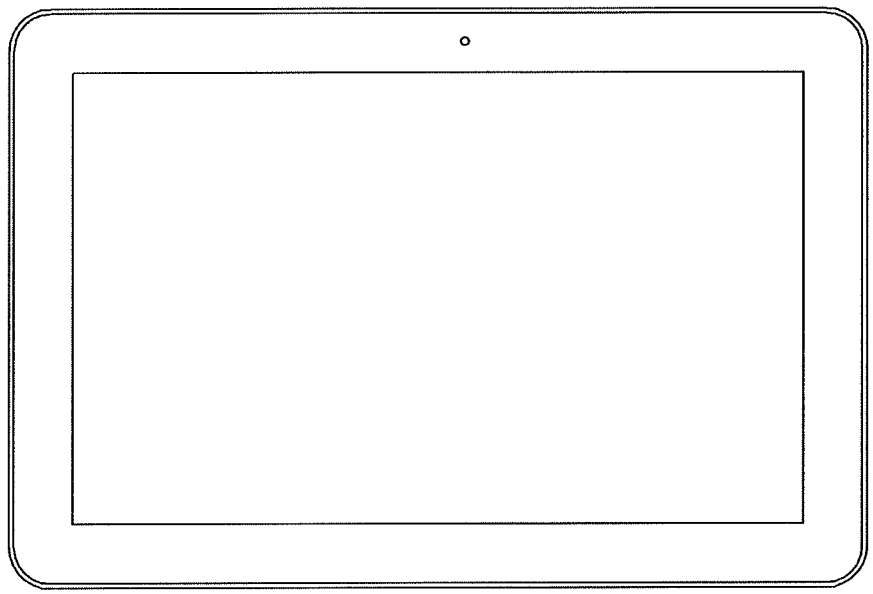
FIGS. 27 through 29 illustrate example semiconductor systems to which one or more semiconductor devices according to some embodiments can be applied.
Figure 28:
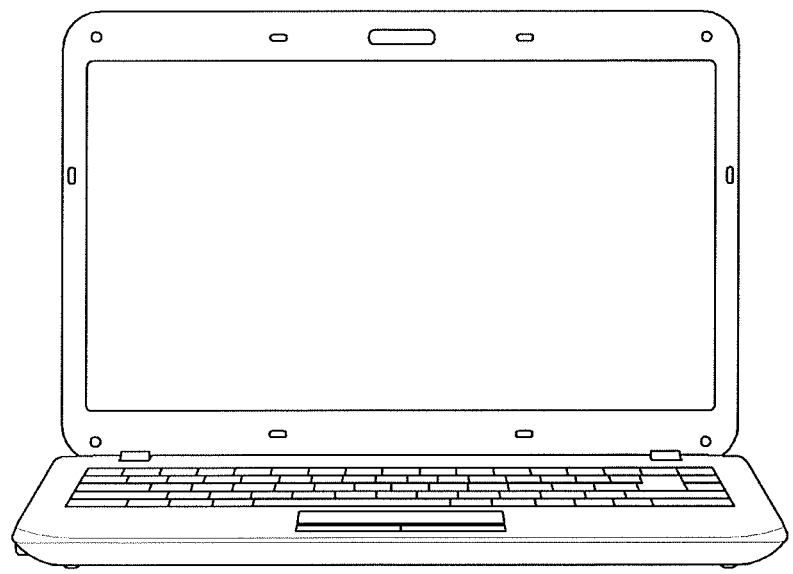
Figure 29:
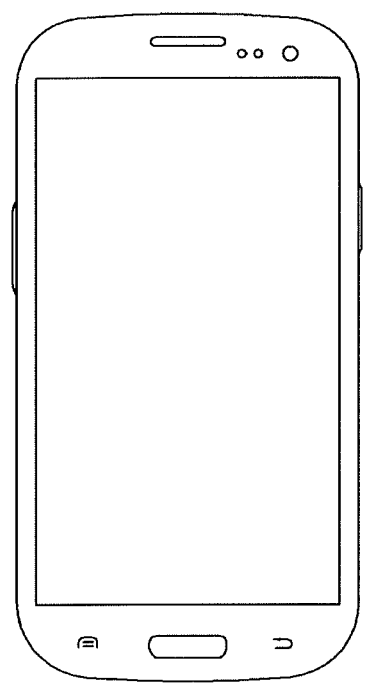

FIGS. 27 to 29 illustrate example semiconductor systems to which one or more semiconductor devices according to some embodiments can be employed. FIG. 27 illustrates an example in which a semiconductor device according to an embodiment is applied to a tablet PC (1200). FIG. 28 illustrates an example in which a semiconductor device according to an embodiment is applied to a notebook computer (1300), and FIG. 29 illustrates an example in which a semiconductor device according to an embodiment is applied to a smart phone (1400). At least one of the semiconductor devices described herein according to some embodiments may be used to form the tablet PC, the notebook computer, the smart phone, and the like.

It is obvious to one skilled in the art that the semiconductor devices according to some embodiments may also be applied to other IC devices not illustrated herein. In the above-described embodiments, only the tablet PC 1200, the notebook computer 1300 and the smart phone 1400 have been exemplified as the semiconductor devices according to the embodiments, but aspects are not limited thereto. In some embodiments, the semiconductor device may be implemented as a computer, an ultra mobile personal computer (UMPC), a work station, a net-book, a personal digital assistant (PDA), a portable computer, a web tablet, a wireless phone, a mobile phone, a smart phone, an e-book, a portable multimedia player (PMP), a potable game console, a navigation device, a black box, a digital camera, a 3-dimensional (3D) television, a digital audio recorder, a digital audio player, a digital picture recorder, a digital picture player, a digital video recorder, a digital video player, or the like.

While the present disclosure has been particularly shown and described with reference to example embodiments thereof, it will be understood by those of skill in the art that various changes in form and details may be made therein without departing from the spirit and scope of the present disclosure as defined by the following claims.

What is claimed is:

1. A semiconductor device, comprising:
    a first fin-shaped pattern and a second fin-shaped pattern arranged in a row in a first direction;
    a trench between the first fin-shaped pattern and the second fin-shaped pattern;
    a field insulating layer filling a portion of the trench;
    an insulating line pattern on the field insulating layer between the first fin-shaped pattern and the second fin-shaped pattern, the insulating line pattern being spaced apart from the first and second fin-shaped patterns; and
    a liner on a sidewall of the insulating line pattern,
    wherein the insulating line pattern extends in a second direction that is perpendicular to the first direction,
    wherein the insulating line pattern has a bottom surface lower than a top surface of the first fin-shaped pattern and lower than a top surface of the second fin-shaped pattern,
    wherein a height of the liner is substantially equal to a height of the insulating line pattern, and
    wherein the field insulating layer is overlapped with the insulating line pattern, such that the insulating line pattern is only on the field insulating layer.

2. The semiconductor device according to claim 1, wherein the insulating line pattern is in direct contact with the field insulating layer.

3. The semiconductor device according to claim 1, wherein the liner is not in contact with the first and second fin-shaped patterns.

4. The semiconductor device according to claim 3, wherein the liner includes a material having an etch selectivity with respect to the insulating line pattern.

5. The semiconductor device according to claim 1, further comprising a first gate electrode on the first fin-shaped pattern and a second gate electrode on the second fin-shaped pattern,
    wherein a top surface of the first gate electrode, a top surface of the second gate electrode, and a top surface of the insulating line pattern are substantially coplanar with each other.

6. The semiconductor device according to claim 5, further comprising an interlayer insulating layer covering sidewalls of the first and second gate electrodes and the insulating line pattern, the interlayer insulating layer being on the first and second fin-shaped patterns and the field insulating layer,
    wherein a top surface of the interlayer insulating layer is substantially coplanar with a top surface of the insulating line pattern.

7. The semiconductor device according to claim 1, further comprising an interlayer insulating layer on the first and second fin-shaped patterns and the field insulating layer, the interlayer insulating layer being between the first fin-shaped pattern and the liner.

8. The semiconductor device according to claim 7, wherein the field insulating layer is in direct contact with the interlayer insulating layer.

9. The semiconductor device according to claim 1, wherein:
    the field insulating layer covers a lower portion of the first fin-shaped pattern, an upper portion of the first fin-shaped pattern protruding above the field insulating layer, and
    a height of the insulating line pattern is greater than a height of the upper portion of the first fin-shaped pattern.

10. The semiconductor device according to claim 1, wherein the liner is between the first fin-shaped pattern and the insulating line pattern.

11. A semiconductor device, comprising:
    a first fin-shaped pattern and a second fin-shaped pattern adjacent to each other, each of the first and second fin-shaped patterns having a long side and a short side;
    a field insulating layer covering lower portions of the first and second fin-shaped patterns, upper portions of the first and second fin-shaped pattern protruding above the field insulating layer;
    an interlayer insulating layer covering the upper portions of the first and second fin-shaped patterns and the field insulating layer, the interlayer insulating layer including a first trench between the short side of the first fin-shaped pattern and the short side of the second fin-shaped pattern, the first trench being spaced apart from the first and second fin-shaped patterns; and
    an insulating line pattern in the first trench,
    wherein a height of the insulating line pattern is greater than a height of the upper portion of the first fin-shaped pattern, and greater than a height of the upper portion of the second fin-shaped patterns, and
    wherein the field insulating layer is overlapped with the insulating line pattern, such that the insulating line pattern is only on the field insulating layer.

12. The semiconductor device according to claim 11, wherein the insulating line pattern directly contacts the field insulating layer.

13. The semiconductor device according to claim 11, wherein:
    the interlayer insulating layer further comprises a second trench on the upper portion of the first fin-shaped pattern and a third trench on the upper portion of the second fin-shaped pattern, and
    the semiconductor device further comprises:
        a first gate electrode in the second trench and on the first fin-shaped pattern, and
        a second gate electrode in the third trench and on the second fin-shaped pattern,
        wherein top surfaces of the first and second gate electrodes are substantially coplanar with a top surface of the insulating line pattern.

14. The semiconductor device according to claim 13, further comprising:
    a first source/drain region in the upper portion of the first fin-shaped pattern between the first gate electrode and the insulating line pattern; and a second source/drain region in the upper portion of the second fin-shaped pattern between the second gate electrode and the insulating line pattern.

15. A semiconductor device, comprising:
a first fin-shaped pattern and a second fin-shaped pattern arranged in a row in a first direction;
a trench between the first fin-shaped pattern and the second fin-shaped pattern;
a field insulating layer filling a portion of the trench;
an insulating line pattern on the field insulating layer between the first fin-shaped pattern and the second fin-shaped pattern, the insulating line pattern being spaced apart from the first and second fin-shaped patterns;
a liner on a sidewall of the insulating line pattern; and
an interlayer insulating layer on the first and second fin-shaped patterns and the field insulating layer, the interlayer insulating layer being between the first fin-shaped pattern and the liner,
wherein the insulating line pattern extends in a second direction perpendicular to the first direction,
wherein the insulating line pattern has a bottom surface lower than a top surface of the first fin-shaped pattern and lower than a top surface of the second fin-shaped pattern, and
wherein the field insulating layer is overlapped with the insulating line pattern, such that the insulating line pattern is only on the field insulating layer.

16. The semiconductor device according to claim 15, further comprising a third fin-shaped pattern spaced apart from the first and second fin-shaped pattern in the second direction,
wherein the field insulating layer covers a portion of the third fin-shaped pattern, and
wherein the insulating line pattern crosses between the first fin-shaped pattern and the second fin-shaped pattern in the second direction.

17. The semiconductor device according to claim 15, wherein a height of the liner is substantially equal to a height of the insulating line pattern.

18. A semiconductor device, comprising:
a first fin-shaped pattern and a second fin-shaped pattern arranged in a row in a first direction;
a trench between the first fin-shaped pattern and the second fin-shaped pattern;
a field insulating layer filling a portion of the trench;
an insulating line pattern on the field insulating layer between the first fin-shaped pattern and the second fin-shaped pattern, the insulating line pattern being spaced apart from the first and second fin-shaped patterns;
a liner on a sidewall of the insulating line pattern, the liner being between the first fin-shaped pattern and the insulating line pattern; and
an interlayer insulating layer on the first and second fin-shaped patterns and the field insulating layer, the interlayer insulating layer being between the first fin-shaped pattern and the liner,
wherein a height of the liner is substantially equal to a height of the insulating line pattern,
wherein the field insulating layer is in direct contact with the interlayer insulating layer, and
wherein the field insulating layer is overlapped with the insulating line pattern, such that the insulating line pattern is only on the field insulating layer.

19. The semiconductor device according to claim 18, wherein the insulating line pattern is in direct contact with the field insulating layer.

20. The semiconductor device according to claim 18, wherein the insulating line pattern has a bottom surface lower than a top surface of the first fin-shaped pattern.

* * * * *